US007584330B2

(12) United States Patent
McKinney et al.

(10) Patent No.: US 7,584,330 B2
(45) Date of Patent: Sep. 1, 2009

(54) MULTI-PROCESSOR DATA COHERENCY

(75) Inventors: Arthur C. McKinney, Madison, AL (US); Charles H. McCarver, Jr., Huntsville, AL (US); Vahid Samiee, Austin, TX (US)

(73) Assignee: Intergraph Hardware Technologies Company, Las Vegas, NV (US)

( * ) Notice: Subject to any disclaimer, the term of this patent is extended or adjusted under 35 U.S.C. 154(b) by 148 days.

(21) Appl. No.: 10/886,231

(22) Filed: Jul. 7, 2004

(65) Prior Publication Data

US 2005/0188009 A1    Aug. 25, 2005

Related U.S. Application Data

(63) Continuation of application No. 10/037,129, filed on Jan. 4, 2002, now abandoned, which is a continuation of application No. 08/802,827, filed on Feb. 19, 1997, now Pat. No. 6,374,329.

(60) Provisional application No. 60/011,979, filed on Feb. 20, 1996, provisional application No. 60/011,932, filed on Feb. 20, 1996.

(51) Int. Cl.
*G06F 12/08* (2006.01)
(52) U.S. Cl. ...................... 711/146; 711/144
(58) Field of Classification Search ........... None
See application file for complete search history.

(56) References Cited

U.S. PATENT DOCUMENTS

| 4,394,731 A | 7/1983 | Flusche et al. ............ 711/145 |
| 4,426,688 A | 1/1984 | Moxley ...................... 365/200 |
| 4,484,267 A | 11/1984 | Fletcher ..................... 711/124 |
| 4,710,926 A | 12/1987 | Brown et al. .................. 371/9 |
| 4,745,524 A | 5/1988 | Patton, III ................... 361/399 |
| 4,868,738 A | 9/1989 | Kish et al. .................. 364/200 |
| 4,934,764 A | 6/1990 | Leitermann et al. ......... 312/111 |
| 5,055,999 A | 10/1991 | Frank et al. ................. 711/163 |
| 5,067,071 A | 11/1991 | Schanin et al. ............. 710/113 |
| 5,077,736 A | 12/1991 | Dunphy, Jr. et al. ........ 371/10.1 |

(Continued)

FOREIGN PATENT DOCUMENTS

EP        0 661 651        7/1995

(Continued)

OTHER PUBLICATIONS

Patent Cooperation Treaty, Int'l Search Report, Int'l Appl. No. PCT/US 97/21457, mailed on Apr. 23, 1998, 4 pages.

(Continued)

*Primary Examiner*—Denise Tran
(74) *Attorney, Agent, or Firm*—Sunstein Kann Murphy & Timbers LLP

(57) ABSTRACT

A method for maintaining coherent data in a multiprocessor system having a plurality of processors coupled to main memory, where each processor has an internal cache which is externally unreadable outside the processor. The method includes requesting data associated with a memory location in main memory and determining if an external cache coupled to an application specific integrated circuit associated with a second processor contains a reference to the requested data. A snoop cycle is performed on the second processor if the external cache has a reference to the requested data, whereupon a determination is made as to whether the requested data has been modified.

6 Claims, 11 Drawing Sheets

U.S. PATENT DOCUMENTS

| | | | | |
|---|---|---|---|---|
| 5,117,350 | A | 5/1992 | Parrish et al. | 395/425 |
| 5,119,481 | A | 6/1992 | Frank et al. | 710/100 |
| 5,126,954 | A | 6/1992 | Morita | 364/708 |
| 5,151,994 | A | 9/1992 | Wille et al. | 395/800 |
| 5,201,038 | A | 4/1993 | Fielder | 395/325 |
| 5,226,039 | A | 7/1993 | Frank et al. | 370/405 |
| 5,245,563 | A | 9/1993 | Hauck, Jr. | 708/499 |
| 5,247,673 | A | 9/1993 | Costa et al. | 395/650 |
| 5,251,308 | A | 10/1993 | Frank et al. | 711/163 |
| 5,265,235 | A | 11/1993 | Sindhu et al. | 395/425 |
| 5,274,789 | A | 12/1993 | Costa et al. | 711/206 |
| 5,282,201 | A | 1/1994 | Frank et al. | 370/403 |
| 5,297,265 | A | 3/1994 | Frank et al. | 711/202 |
| 5,313,647 | A | 5/1994 | Kaufman et al. | 718/102 |
| 5,335,325 | A | 8/1994 | Frank et al. | 711/163 |
| 5,341,483 | A | 8/1994 | Frank et al. | 711/206 |
| 5,341,508 | A | 8/1994 | Keeley et al. | 395/800 |
| 5,352,123 | A | 10/1994 | Sample et al. | 439/61 |
| 5,371,896 | A | 12/1994 | Gove et al. | 395/800 |
| 5,390,326 | A | 2/1995 | Shah | 395/575 |
| 5,394,555 | A | 2/1995 | Hunter et al. | 711/148 |
| 5,406,607 | A | 4/1995 | Marietta | 377/64 |
| 5,423,037 | A | 6/1995 | Hvasshovd | 395/600 |
| 5,452,447 | A | 9/1995 | Nelson et al. | 707/205 |
| 5,493,728 | A | 2/1996 | Solton et al. | 711/113 |
| 5,513,314 | A | 4/1996 | Kandasamy et al. | 714/6 |
| 5,551,048 | A | 8/1996 | Steely, Jr. | 707/201 |
| 5,560,027 | A | 9/1996 | Watson et al. | 395/800 |
| 5,574,944 | A | 11/1996 | Stager | 710/5 |
| 5,623,628 | A | 4/1997 | Brayton et al. | 395/468 |
| 5,634,110 | A | 5/1997 | Laudon et al. | 711/145 |
| 5,649,194 | A | 7/1997 | Miller et al. | 707/200 |
| 5,675,787 | A | 10/1997 | Miller et al. | 707/104 |
| 5,680,576 | A | 10/1997 | Laudon | 711/145 |
| 5,689,700 | A | 11/1997 | Miller et al. | 707/10 |
| 5,752,264 | A * | 5/1998 | Blake et al. | 711/144 |
| 5,787,476 | A | 7/1998 | Laudon et al. | 711/141 |
| 5,860,114 | A * | 1/1999 | Sell | 711/146 |
| 5,991,895 | A | 11/1999 | Laudon et al. | 714/8 |
| 6,112,019 | A | 8/2000 | Chamdani et al. | 712/214 |
| 6,631,447 | B1 * | 10/2003 | Morioka et al. | 711/141 |

FOREIGN PATENT DOCUMENTS

| | | |
|---|---|---|
| EP | 0 288 636 | 11/1998 |
| GB | 21715424 | 8/1986 |
| GB | 2 257 273 | 1/1993 |
| JP | 94-6 | 6/1992 |
| JP | 5 40690 | 2/1993 |
| JP | 05040690 | 2/1993 |
| JP | 100-2 | 6/1993 |
| JP | 101-16 | 8/1993 |
| JP | 107-19 | 7/1994 |
| JP | 109-7 | 12/1994 |
| WO | WO 95/02307 | 1/1995 |
| WO | WO 95/14279 | 5/1995 |
| WO | WO 95/22111 | 8/1995 |
| WO | WO 95/25306 | 9/1995 |
| WO | WO 96/23268 | 8/1996 |
| WO | WO 96/30847 | 10/1996 |

OTHER PUBLICATIONS

Patent Cooperation Treaty, Int'l Search Report, Int'l Appl. No. PCT/US97/21458, mailed Apr. 23, 1998, 3 pages.
Patent Cooperation Treaty, Int'l Search Report Int'l Appl. No. PCT/US 97/21459, mailed on Apr. 23, 1998, 4 pages.
Patent Cooperation Treaty, Int'l Search Report, Int'l Appl. No. PCT/US 97/21460, mailed on Apr. 23, 1998, 5 pages.
Patent Cooperation Treaty, Int'l Search Report, Int'l Appl. No. PCT/US 97/21466, mailed on Apr. 23, 1998, 3 pages.
Patent Cooperation Treaty, Int'l Search Report, Int'l Appl. No. PCT/21733, mailed on Apr. 23, 1998, 3 pages.
Patent Cooperation Treaty, Int'l Search Report, Int'l Appl. No. PCT/US 97/21734, mailed on Apr. 23, 1998, 4 pages.
Anderson, T., et al. "Serverless Network File Systems," Operating Systems Review (SIGOPS), vol. 29, No. 5, Dec. 1, 1995, pp. 109-126.
Carter, J., et al. "Network Multicomputing Using Recoverable Distributed Shared Memory," Proceedings of the Spring Computer Society International Conference (COMPCON), San Francisco, Feb. 22-26, 1993, pp. 519-527.
Huber, J., et al. "PPFs: A High Performance Portable Paralel File System," Proceedings of the International Conference on Supercomputing, Barcelona, Jul. 3-7, 1995, pp. 385-294.
"Java Dynamic Class Loader," IBM Technical Disclosure Bulletin, vol. 39, No. 11, Nov. 1996, pp. 107-108.
Lee, E., et al. "Petal Distributed Virtual Disks," $7^{th}$ International Conference on Architectural Support for Programming Languages and Operation Systems, Cambridge, MA, Oct. 1-5, 1996, pp. 84-92.
Neal, D. "The Harvest Object Cache in New Zealand," Computer Networks and ISDN Systems, vol. 11, No. 28, May 1996, pp. 1415-1430.
Raghavan, G. "A Domain Model of WWW Browsers," Proceedings of Southeastcon, Bringing Together Education, Science and Technology, Tampa, Apr. 11-14, 1996, pp. 436-439.
Ng. T. "The Design and Implementation of a Reliable Distributed Operating System-Rose," Proc, 1990, pp. 2-11.
Yeung, D., et al. "MGS A Multigrain Shared Memory System," Computer Architecture News, vol. 24, No. 2, May 1, 1996, pp. 44-55.
Henskens et al. "Course and Fine Grain Objects in a Distributed Persistent Store," Object Orientation in Operating Systems, 1993, IEEE, pp. 116-123.
Amaral et al. "A Model for Persistent Shared Memory Addressing in Distributed Systems," Object Orientation in Operating Systems, 1992, IEEE, pp. 2-11.
Irelenbusch et al. "Towards a Resilient Shared Memory Concept for Distributed Persistent Object Systems," Proceedings of the $28^{th}$ Annual Hawaii Int'l. Conference on System Sciences, 1995, IEEE, pp. 675-684.
Lea et al. "Cool: System Support for Distributed Programming," Communications of the ACM, vol. 36, No. 9, pp. 37-46.
Wilson, Andrew W., "Organization and Statisitcal Simulation of Hierarchical Multiprocessors," UMI Dissertation Information Service (1985).
Li, Kai, "Shared Virtual Memory on Loosely Coupled Multiprocessors," Yale University, Department of Computer Science, (Sep. 1986).
Wilson, Andrew, W. "Hierachical Cache/Bus Architecture for Shared Memory Multiprocessors," ACM, pp. 244-252 (1987).
Carter, J.B. et al., "Optimistic Implementation of Bulk Data Transfer Protocols," In Proceedings of the 1989 Signetrics Conference, pp. 61-69 (May 1989).
Carter, J.B. et al., "Distributed Operating Systems Based on a Protected Global Virtual Address Space," In the Proceedings of the Third Workshop on Workstation Operating Systems, (WWOS) (May 1992).
Carter, J.B. et al., "Flex: A Tool for Building Efficient and Flexible Systems," In the Proceedings of the Fourth Workshop on Workstation Operating Systems (WWOS) (Oct. 1993).
Carter, John B., "Design of the Munin Distributed Shared Memory Station," To appear in the special issue of the Journal of Parallel and Distributed Computing on Distributed Shared Memory (1995).
Carter, J.B. et al., "Techniques for Reducing Consistency-Related Communication in Distributed Shared Memory Systems," ACM Transactions on Computer Systems, pp. 205-243, vol. 13, No. 3 (Aug. 1995).
Carter, J.B. et al., "Reducing Consistency Traffic and Cache Misses in the Avalance Multiprocessor," Universiey of Utah techincal report.
Tricord Systems, Inc. Web Page, http://www.tricord.com/2/10/10-3-96.html, printed May 22, 1997.
Network Appliance, Inc. Web Page http://www.netapp.com/products/level3/nfs.html, printed on May 22, 1997.

Network Appliance, Inc. Web Page, http://www.netapp.com/products/level13/ontap.html, printed on May 22, 1997.

Network Appliance, Inc. Web Page, http://www.netapp.com/products/level13/windows.html, printed on May 22, 1997.

Jou et al., "A Scalable Snoopy Coherence Scheme on Distributed Shared-Memory Multiprocessors", Supercomputing '92, (1992), pp. 652-660.

Mudge et al., "Multiple Bus Architectures", Computer, (1987), pp. 42-48.

Dijk et al, "EMPS: The design of an architecture for a distributed homogeneous multiprocessor system", Microprocessors and Microsystems, (1991), vol. 15, No. 4, pp. 187-194.

Per Stenström, "Reducing Contention in Shared-Memory Multiprocessors", Computer, (1988), pp. 26-36.

Nayfeh et al., The Impact of Shared-Cache Clustering in Small-Scale Share-Memory Multiprocessors, IEE Computer Soc. Press, (1996), pp. 74-84.

Laudon, James Pierce, Ph.D., "Architectural and Implementation Tradeoffs for Multiple-Context Processors", Copyright @ 1994 by Laudon, James Pierce, a dissertation, pp. 1-186.

Heinrich, et al.., "The Performance Impact of Flexibility in the Stanford Flash Multiprocessor", appeared in Proceedings of the 6th International Conference on Architectural Support for Programming Languages and Operating Systems (ASPLOS-VI), San Jose, CA (Oct. 1994) pp. 1-12.

Heinlein, et al., "Integration of Message Passing and Shared Memory in the Stanford Flash Multiprocessor", Proceedings of the $6^{th}$ International Conference on Architectural Support for Programming Languages and Operating Systems (ASPLOS), Oct. 1994, pp. 1-13.

Gustavson, et al., "Overview of the Scalable Coherent Interface", IEEE STD 1596 (1993) pp. 488-490.

Hagersten, et al., "DDM-A Cache-Only Memory Architecture", IEEE (1992), pp. 44-54.

Sam Dickey, Contributor, "Convex Takes A RISC on HP", HP Professional, 1 P'g.

Baer, et al., "Architectural Choices for Multilevel Cache Hierarchies", Proceedings of the 1987 International Conference on Parallel Processing, (Aug. 17-21, 1987), pp. 257-261.

Baer, et al., "On The Inclusion Properties for Multi-Level Cache Hierarchies", IEEE (1988) pp. 73-80.

Brewer, Tony, "A Highly Scalable System Utilizing up to 128 PAA-RISC Processors", Convex Computer Corporation, Proceedings of the $40^{th}$ IEEE Computer Society International Conference (COMPCON), 1995, pp. 133-140.

Brewer, et al., "The Evolution of the HP/Convex Exemplar", IEEE (1997), pp. 81-86.

Chaiken, et al., "LimitLESS Directories: A Scalable Cache Coherence Scheme", Appeared in ASPLOS-IV, (Apr. 1991), pp. 1-11.

Archibald, et al., "An Economical Solution to the Cache Coherence Problem", 1984 IEEE, pp. 355-362.

Archibald, et al., "Cache Coherence Protocols: Evaluation Using a Multiprocessor Simulation Model", ACM Transactions on Computer Systems, vol. 4 (Nov. 1986), pp. 273-298.

Archibald, "A Cache Coherence Approach for Large Multiprocessor Systems", proceedings of the International Conference on Supercomputing, (1988), pp. 282-290, Copyright @ 1988, Association for Computing Machinery.

White Paper, "The Dolphin SCI Interconnect" (Feb. 1996), Dolphin Interconnect Solutions, pp. 1-16.

Tomasevic, et al., "The Cache Coherence Problem in Shared-Memory Multiprocessors: Hardware Solutions", IEEE Computer Society Press, IEEE (1993) pp. 1-281.

Wilson, Andrew Wilkins, Jr., "Organization and Statistical Simulation of Hierarchical Multiprocessors", 1985, UMI Dissertation Services from ProQuest Company, pp. 1-168.

Lenoski, Daniel E., "Scalable Shared-Memory Multiprocessing", (1995) by Morgan Kaufmann Publishers, Inc., pp. 1-331.

Goodman, et al., "The Wisconsin Multicube: A New Large-Scale Sache-Coherent Multiprocessor", proceedings of the $15^{th}$ International Symposium on Computer Architecture (1988) pp. 291-300, Copyright @ 1988 by IEEE.

Wilson, et al., "Shared Memory Multiprocessors: The Right Approach to Parallel Processing" (1989), IEEE, pp. 72-80.

Weber, et al., "The Mercury Interconnect Architecture: A Cost-effective Infrastructure for High-performance Servers", ISCA (1997) Copyright @ 1997 ACM, pp. 98-107.

Tomasevic, et al., "Hardware Approaches to Cache Coherence in Shared-Memory Multiprocessors, Part 1", IEEE Computer Society (Oct. 1994), pp. 52-59.

Tomasevic, et al., "Hardware Approaches to Cache Coherence in Shared-Memory Multiprocessors, Part 2", IEEE Micro, published by IEEE Computer Society, vol. 14, No. 6, pp. 60-66.

Lenoski, et al., "The Dash Prototype: Implementation and Performance", 1992 ACM, pp. 92-103.

Leonski, et al., "The Directory-Based Cache Coherence Protocol for the Dash Multiprocessor", IEEE (1990), pp. 148-159.

Lovett, et al., "Sting: A CC-NUMA Computer System for the Commercial Marketplace", ISCA (1996) Copyright @ 1996 ACM, pp. 308-317.

McMillan, et al., "Formal Verification of the Gigamax Cache Consistency Protocol", International Symposium on Shared Memory Multiprocessing, Tokyo, Japan (Apr. 1991), pp. 242-251.

Jr., Simoni, Richard T., "Cache Coherence Directories for Scalable Multiprocessors" (Mar. 1995), pp. 1-145.

IEEE Standard for Scalable Coherent Interface (SCI), Microprocessor and Microcomputer Standards Subcommittee of the IEEE Computer Society, IEEE-SA Standards Board (Mar. 19, 1992), pp. 1-243.

Gharachorloo, Kourosh, "Memory Consistency Models for Shared-Memory Multiprocessors", A Dissertation, (Dec. 1995), pp. 1-372.

Joe, et al., "Hierarchy Impact and Performance Evaluation of ASURA: A Distributed Shared Memory Multiprocessor" (Aug. 19, 1992), pp. 1-8.

Saito, et al., "An Implementation of the Event Correspondent Cache Coherency Scheme and Its Performance Analysis" (Jan. 22, 1993), pp. 129-136.

Saito, et al., "The Event Correspondent Cache Coherency Scheme and Its Application to Barrier Synchronization" (Aug. 19, 1992), pp. 9-16.

Fraser, et al., "An Overview of Asura's Network with Simulation Results" (Aug. 12, 1998), pp. 133-140.

Agarwal, et al., "Sparcle: An Evolutionary Processor Design for Large-Scale Multiprocessors" (Mar. 12, 1993), pp. 1-23.

Saito, et al., "Event Correspondent Cache Coherence Control Scheme Application Example and Basic Performance Thereof" (Jan. 22, 1993), pp. 1-18.

Archibald, J. "High Performance Cache Coherence Protocols for Shared-Bus Multiprocessors" (Jun. 11, 1986), pp. 1-20.

Agarwal, et al., "The MIT Alewife Machine: Architecture and Performance", appeard in ISCA (1995), pp. 1-12.

Heinlein, et al., "Integrating Multiple Communication Paradigms in High Performance Multiprocessors", Technical Report CSL-TR-94-604 (Feb. 10, 1994), pp. 1-30.

Joe, et al., "An Analytical Model of the Asura System", computer Architecture 99-17 (Mar. 12, 1993), pp. 1-15.

Joe, et al., "Hierarchical Properties and Evaluation of the "Asura" Distributed Shared Memory Multiprocessor System", Computer Architecture 95-1 (Aug. 19, 1992), pp. 1-12.

Mori, et al., "Overview of the Asura: A Distributed Shared Memory Multiprocessor", Computer Architecture 94-6 (Jun. 12, 1992), pp. 1-12.

Tilborg, Dr. Andre Van, "Semi-Annual Technical Progress", Nov. 1989-Mar. 1990, R&T Project Code: 4331685, Office of Naval Research, Code 1133, pp. 1-20.

Mori, et al., "A Distributed Shared Memory Multiprocessor: Asura—Memory and Cache Architectures", (1993), ACM 0-8186-4340-4/93/0011, pp. 740-749.

Sequent, "Sequent's NUMA-Q Architecture", Copyright @ 1997, Sequent Computer Systems, Inc., pp. 1-9.

Sequent, "Sequent's NUMA-Q SMP Architecture, How It Works and Where It Fits In High-Performance Computer Architectures", Copyright @ 1997, Sequent Computer Systems, Inc., pp. 1-18.

Saito, et al., "Event Correspondent Cache Coherence Control Scheme and Application Thereof to Barrier Synchronization", Computer Architecture 95-2 (Aug. 19, 1992), pp. 1-14.

Goshima, et al., "High-Performance Cache System Supporting Communication Between Fine-Grain Processors", Computer Architecture 101-16, (Aug. 20, 1993), pp. 1-17.
Goshima, et al., "Virtual Queue: A Message Communication Mechanism for Massively Parallel Computers", Computer Architecture 107-19 (Jul. 22, 1994), pp. 1-17.
Lenoski, et al., "The Stanford Dash Multiprocessor", IEEE, (Mar. 1992), pp. 63-79.
Mori, et al., "Self-Cleanup Cache Evaluation", Computer Architecture 109-7 (Dec. 13, 1994), pp. 1-15.
Mori, et al., "Proposal for Self-Clean-Up Type Write-Back Cache", Computer Architecture 100-2 (Jun. 11, 1993), pp. 1-13.
Erickson, C. B., Ph.D., "Design and Evaluation of A Hierarchical Bus Multiprocessor", Michigan State University, (1991), Dept. of Electrical Engineering, pp. 1-155.
Archibald, J.K., "The Cache Coherence Problem in Shared- Memory Multiprocessors", Technical Report (Feb. 6, 1987), Dept. of Computer Science and Engineering, FR-35, University of Washington, pp. 1-215.
Lenoski, Daniel E., "The Design and Analysis of DASH: A Scalable Directory-Based Multiprocessor", A Disseratation (Copyright @ 1991), pp. 1-173.
Simoni, Richard Thomas, Jr., Ph.D., "Cache Coherence Directories for Scalable Multiprocessors", A Dissertation (Jul. 1992), pp. 1-145.
McMillan, Kenneth L., "Symbolic Model Checking: An Approach To The State Explosion Problem", Submitted to Carnegie Mellon University in Partial Fulfillment of the Requirements for the Degree of Dr. of Philosophy in Computer Science (1992), pp. 11-212.
Pacer Online Electronic Access Service, Pacer Docket Report for Case #: 6:04-cv-00214-LED, *Intergraph Hardware Technologies Co. v. Hewlett Packard Co.,* (E.D. Tex. filed May 7, 2004), terminated Feb. 2, 2005.
Pacer Docket Report #: 1, Complaint against Hewlett-Packard Company , filed by Intergraph Hardware Technologies Company, Inc. (Entered: May 7, 2004).
Pacer Docket Report #: 29, Amended Answer to *Complaint Including Amended Affirmative Defenses and*, Counterclaim against Intergraph Corporation, Intergraph Hardware Technologies Company, Inc by Hewlett-Packard Company (Entered: Jul. 15, 2004).
Pacer Docket Report #:74, Brief filed *Integraph Hardware Technologies Company, Inc.'s Opening Claim Construction Brief* by Intergraph Hardware Technologies Company, Inc. (Entered: Nov. 5, 2004).
Pacer Docket Report #: 74-3, Exhibit B To Intergraph Hardware's Opening Claim Construction Brief Intergraph Hardware's Proposed Construction And Supporting Evidence (Entered: Nov. 5, 2004).
Pacer Docket Report #: 74-18, Exhibit E To Intergraph Hardware's Opening Claim Construction Brief—"The Oxford Encyclopedic English Dictionary", Third Edition, New York, Oxford University Press, 1996 (Entered: Nov. 5, 2004).
Pacer Docket Report #: 74-19, Exhibit F To Intergraph Hardware's Opening Claim Construction Brief—The IEEE Standard Dictionary of Electrical and Electronic Terms, Sixth Edition, Published by the Electrical and Electronics Engineers, Inc., 1996 (Entered: Nov. 5, 2004).
Pacer Docket Report #: 87, Brief filed *Intergraph Hardware Technologies Company, Inc.'s Reply Claim Construction Brief Pursuant to Local Patent Rule 4-3(c)* by Intergraph Corporation, Intergraph Hardware Technologies Company, Inc. (Entered: Nov. 24, 2004).
Pacer Docket Report #: 93, Memorandum and Opinion, Order: The Court interprets the claim language in the case in the manner set forth. (Entered: Dec. 22, 2004).
Pacer Docket Report #: 94, Transcript of Markman Hearing Proceedings held Dec. 8, 2004 at 9:00 AM before Judge Leonard Davis (Entered: Jan. 3, 2005).
Hewlett-Packard, Hewlett-Packard Company's Preliminary Invalidity Contentions (Executed/served Oct. 4, 2004).
Archibald, et al., "*An Evaluation of Cache Coherency Solutions in Shared-Bus Multiprocessors,*" Draft Article on file with University of Washington Department of Computer Science.
Agarwal, et al., *April: A Processor Architecture for Multiprocessing.* Proceedings of the 17th Annual International Symposium on Computer Architecture, Jun. 1990, pp. 104-114.

Agarwal, et al., *The MIT Alewife Machine: A Large-Scale Distributed-Memory Multiprocessor*, MIT/LCS Technical Memo 454, 1991. Also in Scalable Shared Memory Multiprocessors, Kluwer Academic Publishers, 1991.
Astfalk, et al., "*Cache Coherence in the Convex MPP,* " Internal HP/CONVEX document, Feb. 24, 1994.
Astfalk, et al., "*An overview of the Convex SPP2000 hardware,*"Internal HP/CONVEX document, Mar. 19, 1996.
Astfalk, et al., "*The HP/Convex SPP2000 CTI Interconnect,*" Internal HP/CONEX document, Sep. 27, 1996.
Brewer, et al., Convex Computer Corporation, "*Camelot Coherency Specification Version 1.1,*" Internal HP/CONVEX document No. 700-039430-00, Jan. 28, 1993.
Brewer, Tony, Brewer, Tony, "*Excalibur Architecture Reference,*" Internal HP/CONVEX document, Revision 2.1, Jun. 1996 (including Initial Release, dated Oct. 1994).
Cheriton et al, ParaDiGM: A highly scalable shared memory multicomputer architecture. *IEEE Computer*, vol. 24 No. 2. Feb. 1991.
Dolphin SCI Technology, Dolphin SCI Technology, "*Dolphin Nodechip™ Functional Specification,*" Internal Dolphin SCI Technology document, Aug. 1992.
Gharachorloo, et al., Memory Consistency and Event Ordering in Scalable Shared-Memory Multiprocessors. In Proceedings of the 17th International Symposium on Computer Architecture, pp. 15-16, May 1990.
Gharachorloo, et al., Revision to "Memory Consistency and Event Ordering in Scalable Shared-Memory Multiprocessors". Technical Report CSL-TR-93-568, Computer Systems Laboratory, Stanford University, Apr. 1993.
Hewlett-Packard, HP/CONVEX Computer Corporation, "*Exemplar SPP1000-Series Architecture,*" Internal HP/CONVEX document No. 081-023430-000, First Edition, Nov. 1993.
Hewlett-Packard, CONVEX Computer Corporation, "*Camelot Processor Agent Functional Specification,*" Internal HP/CONVEX document No. 700-033930-000, Nov. 17, 1993.
Hewlett-Packard, CONVEX Computer Corporation, "*Cache Coherency with CxRing,*" Internal HP/CONVEX document, date currently unknown.
Hewlett-Packard, HP/CONVEX Computer Corporation, "*Exemplar SPP1000-Series Architecture,*" Internal HP/CONVEX document No. 081-23430-003, Fourth Edition, May 1996.
Hewlett-Packard, Hewlett-Packard Company, "*Runway Bus Specification,*" Internal HP document, Revision 1.30, Dec. 3, 1993.
Hewlett-Packard, "*Excalibur MAC,*" Internal HP/CONVEX document, Jan. 21, 1994.
Hewlett-Packard, "*Excalibur Functional Specification,*" Internal HP/CONVEX document, dated believed to be 1996.
Hewlett-Packard, Hewlett-Packard Company, "*Runway Bus Specification,*" Internal HP document, Revision 1.30, Dec. 3, 1993.
IEEE, IEEE Standard for Scalable Coherent Interface (SCI) (approved Mar. 19, 1992).
Kuskin, et al., "The Stanford Flash Multiprocessor," In Proceedings of the 21st International Symposium on Computer Architecture, pp. 302-313, Chicago, IL, Apr. 1994.
Lenoski, et al., "Design of the Stanford Dash Multiprocessor," Stanford University, Computer Systems Laboratory Technical Report, CSL-89-403 (Dec. 1989).
Palmer, et al., "*Camelot Coherent Memory Controller Functional Specification,*" Internal HP/CONVEX document No. 700-034130-000, Aug. 1, 1994.
Rashid, et al., Machine-Independent Virtual Memory Management for Paged Uniprocessor and Multiprocessor Architectures (1987).
Schanin, David J., The Design and Development of a Very High Speed System Bus—The Encore Multimax Nanobus (1986).
Simoni, et al., Dynamic Pointer Allocation for Scalable Cache Coherence Directories. In Proceedings of the International Symposium on Shared Memory Multiprocessing, pp. 72-81, Apr. 1991. Also in Shared Memory Multiprocessing, Norihisa Suzuki (Ed.), pp. 463-482, MIT Press, 1992.
Sterling et al., "*A Performance Evaluation of the Convex SPP-1000 Scalable Shared Memory Parallel Computer,*" Conference on High Performance Networking and Computing, Proceedings of the 1995 ACM/IEEE conference on Supercomputing (1995) at p. 55.

Weber, et al., "*The Mercury Interconnect Architecture: A Cost-effective Infrastructure for High-performance Servers,*" Proceedings of the 24th Annnual International Symposium on Computer Architecure, 1997, at pp. 98-107.

Weber, Wolf-Dietrich, "Scalable directories for cache-coherent shared memory multiprocessors," Ph.D. Thesis, Stanford University, 1993, Stanford University Technical Report, CSL-TR-93-557.

Woodbury, et al., Shared Memory Multiprocessors: The Right Approach to Parallel Processing (1989).

Yeung, et al., *How to Choose the Grain Size of a Parallel Computer*. MIT-LCR- TR 739, Feb. 1994.

Lenoski, et al., Scalable Shared-Memory Multiprocessing (Morgan Kaufman Publishers 1995).

Archibald, "A Cache Coherence Approach for Large Multiprocessor Systems", proceedings of the International Conference on Supercomputing, 1988, pp. 337-345, Association for Computing Machinery. IDS Aug. 17, 2005.

Lovett et al., "Sting: A CC-NUMA Computer System for the Commerical Marketplace," ISCA 1996, ACM, pp. 308-317. IDS Aug. 17, 2005.

Gharachorloo, "Memory Consistency Models for Shared-Memory Multiprocessors", a dissertation, Dec. 1995, Appendix K. IDS Mar. 28, 2006.

Lenoski et al., "The Stanford Dash Multiprocessor," IEEE, Mar. 1992, pp. 63-79. IDS Mar. 28, 2006.

Erickson, "Design and Evaluation of a Hierarchical Bus Multiprocessor," Michigan State University thesis dated 1991, Dept. of Electrical Engineering. IDS Mar. 28, 2006.

Intergraph Hardware Technologies Company, Inc.'s Opening Claim Construction Brief. IDS May 19, 2008.

Intergraph Hardware Technologies Company, Inc.'s Reply Claim Construction Brief Pursuant to Local Patent Rule 4-3(c). IDS May 19, 2008.

Memorandum and Opinion, Order. The Court interprets the claim language in the case in the manner set forth. ("Markman Hearing" claim construction.) IDS May 19, 2008.

Hewlett-Packard Company's Preliminary Invalidity Contentions. IDS May 19, 2008.

Brewer et al., CONVEX Computer Corporation, "Camelot Coherency Specification Version 1.1," Internal HP/CONVEX document No. 700-039430- 000, Jan. 28, 1993. Chapter 2. IDS May 19, 2008.

Hewlett-Packard, "*Excalibur MAC*," Internal HP/CONVEX document, Jan. 21, 1994. IDS May 19, 2008.

Lenoski et al, Scalable Shared-Memory Multiprocessing (Morgan Kaufman Publishers 1995), §6.5. Current IDS.

\* cited by examiner

MULTI-PROCESSOR DATA COHERENCY

PRIORITY

This application is a continuation of U.S. application Ser. No. 10/037,129, filed Jan. 4, 2002, abandoned, which in turn is a continuation of U.S. application Ser. No. 08/802,827, filed Feb. 19, 1997, now issued as U.S. Pat. No. 6,374,329, which claims priority from subject matter disclosed in two provisional applications entitled HIGH-AVAILABILITY SUPER SERVER, having Ser. No. 60/011,979, filed Feb. 20, 1996, and METHOD AND APPARATUS FOR SIGNAL HANDLING ON GTL-TYPE BUSES, having Ser. No. 60/011,932, filed Feb. 20, 1996. Each of the above described applications are hereby incorporated herein by reference.

FIELD OF THE INVENTION

This invention relates to providing high-availability parallel processing super servers.

SUMMARY

The present invention provides a high-availability parallel processing server that is a multi-processor computer with a segmented memory architecture. The processors are grouped into processor clusters, with each cluster consisting of up to four processors in a preferred embodiment, and there may be up to 5 clusters of processors in a preferred embodiment. Each cluster of processors has dedicated memory buses for communicating with each of the memory segments. The invention is designed to be able to maintain coherent interaction between all processors and memory segments within a preferred embodiment. A preferred embodiment uses Intel Pentium-Pro processors (hereinafter P6). The invention may be modified to utilize other processors, such as those produced by AMD or CYRIX. (Registered trademarks referenced herein belong to their respective owners.) The present invention comprises a plurality of processor segments (a cluster of one or more CPUs), memory segments (separate regions of memory), and memory communication buses (pathways to communicate with the memory segment). Each processor segment has a dedicated communication bus for interacting with each memory segment, allowing different processors parallel access to different memory segments while working in parallel.

The processors, in a preferred embodiment, may further include an internal cache and flags associated with the cache to indicate when the data within the cache may be out of date, or if the data within the cache is data shared by other processors within the invention. Through use of setting the internal cache flag to a desired state, the contents of the internal cache of a processor may be effectively monitored from a vantage point external to the processor. This would allow for maintaining multi-processor cache coherency without requiring all processors to observe all other processors memory traffic.

The processors, in a preferred embodiment, may further comprise processors with caches external to the processor, where such cache may be an external write-back cache. There may also be caches associated with the memory communication buses to allow for enhanced memory access. In a preferred embodiment utilizing P6 processors, the processors may also be configured to operate in clusters of up to four processors to a processor segment. Note that this four processor limitation is one due to the P6 architecture. If an alternate processor is used, in which the alternate processor design allows more than four processors to a bus, then cluster size referenced herein may be adjusted accordingly.

DETAILED DESCRIPTION OF SPECIFIC EMBODIMENTS

Figure 1:
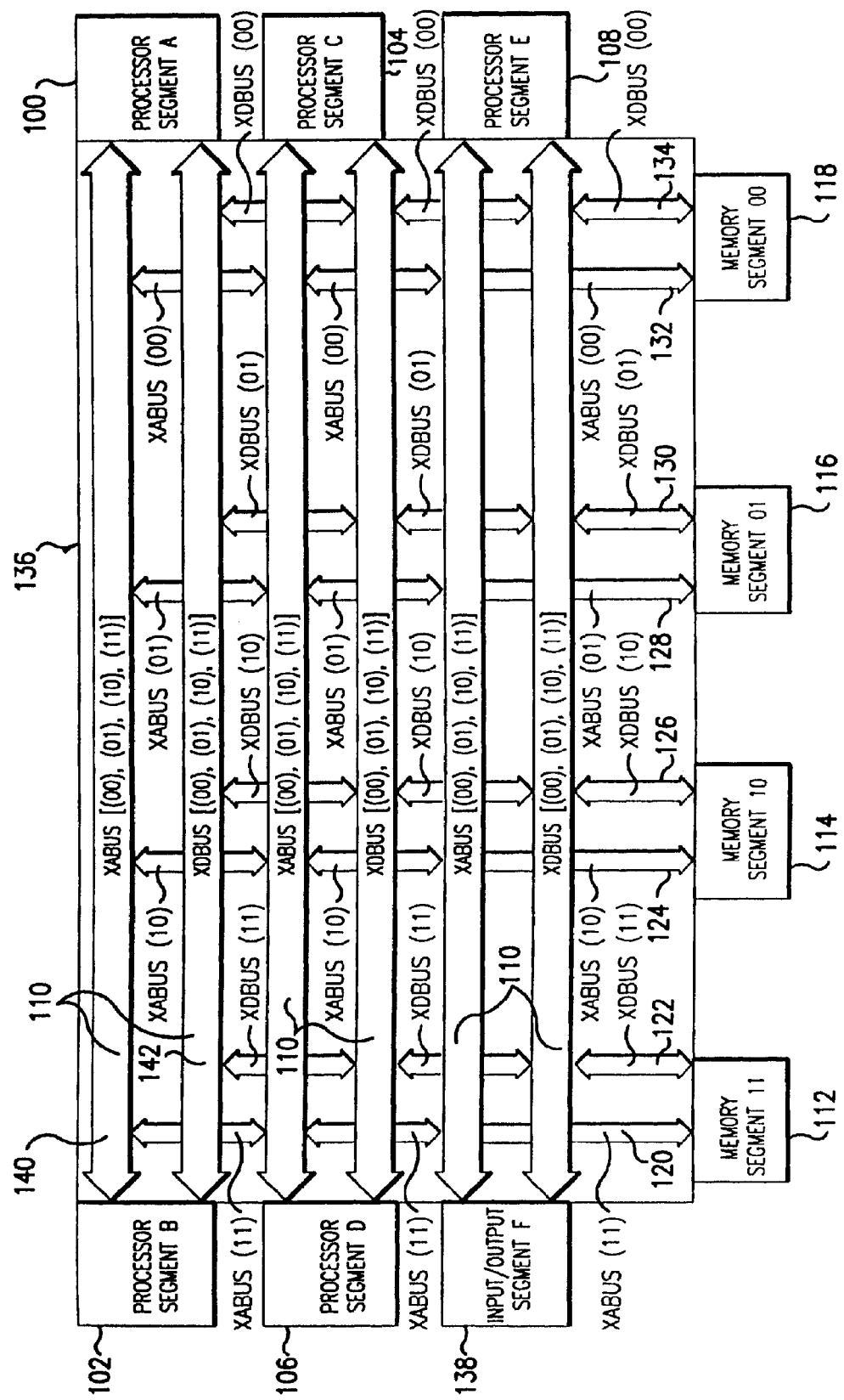
FIG. 1 is a schematic showing a high level bus structure of one embodiment of the invention.

The present invention provides a high-availability parallel processing server utilizing a scalable building-block architecture. Building-block design reduces development efforts due to block reuse in related architecture designs. A preferred embodiments of the invention may utilize the bus described in the provisional application entitled "Method and Apparatus for Signal Handling on GTL-type Buses" (hereinafter "enhanced GTL-type bus"), Ser. No. 60/011,932, which was incorporated hereinabove by reference. In addition, a preferred embodiment may also utilize the timing technology disclosed in U.S. Pat. No. 5,546,569 to Proebsting; this patent is incorporated herein by reference.

A preferred embodiment may have from one to twenty processors, although with the invention's present design, more are possible. A preferred embodiment will utilize P6 processors (hereinafter a preferred P6 embodiment), and thus up to four processors may be grouped to form a processor segment, and each processor segment is expected to have an internal bus rate of 66 to 75 MHZ. This bus rate is independent of the rate for the rest of the computing system. Alternate embodiments utilizing non-P6 processors may have different internal bus rates, as the internal bus rate of a preferred embodiment is independent of the invention's communication protocols.

In a preferred P6 embodiment, each processor segment may also support up to four independent coherent buses, a limitation due to the P6 package and pin-connector architecture; denser packaging technology may allow for more independent buses. Each coherent bus is separated into an address bus and a data bus. Preferred embodiments will utilize the enhanced GTL-type bus referenced hereinabove, so that each data bus may operate at up to 4 GByte per second data transfer rate with four buses. In a preferred P6 embodiment, a sustained data transfer rate for each bus is expected to be approximately 710 MBytes per second. With utilization of the enhanced GTL bus, the data bus may operate at 133 to 150 MHZ, and the address bus posts 33-133 million transactions per second, and may operate at 66 to 75 MHZ. Note that these operating speeds are possible if a different high-speed bus is used (e.g. ECL). In an alternate preferred embodiment having a standard non-enhanced (i.e. slow) bus, the data bus may operate at approximately 100 MHZ. The address bus may also be accordingly reduced in speed to compensate for the slower bus.

In a preferred embodiment, up to two I/O segments may be supported. Each Segment may provide up to eight PCI slots and four E/ISA slots, as well as include multiple SCSI, SSA, 10/100 MBit Ethernet, or Fiber Channels pathways. Preferably, up to four GBytes of main memory will be supported. An external tag/cache may be configured to support 256K or 512K cache lines. In addition, in a preferred embodiment, different configurations of high availability may be chosen.

Preferred embodiments may also provide system administrators with information about recoverable system errors, faults, and operating environment, as well as to include programmable recovery actions in case of fatal errors. Preferably, a desktop management interface will allow the system administrator to monitor and configure the invention locally or through a network.

Although the invention may be implemented with various central processing units (CPUs), in a preferred embodiment, the Intel P6 (or P6 MMX) processor will be used. According to the Intel specification, up to four P6 processors may be clustered on an In-Order split-transaction CPU bus to create a four way symmetrical multi-processor (SMP) platform. As used in this specification and claims that follow, such clustering of CPUs is referenced as a "processor segment." Each processor/cache combination interfaces directly to the CPU bus, allowing system integrators to provide similar looking SMP hardware. Further detailed information regarding the P6 processor may be found the following Intel's references: *Pentium and Pentium Pro Processors and Related Products*; and the *Pentium Pro Family Developer's Manual* three volume set: *Volume 1: Specifications* (Order Number 242690), *Volume 2: Programmer's Reference Manual* (Order Number 242691), and *Volume 3: Operating System Writer's Manual* (Order Number 242692); these references are incorporated herein by reference. Additional information may also be found at Intel's World Wide Web site (http://www.intel.com).

FIG. 1 shows that a preferred P6 embodiment of the invention which extends the standard P6 quad-CPU SMP implementation to allow coherent integration of more than one processor segment 100. The P6 design architecture results in as many as twenty processors on five processor segments 102-108 being interconnected. This is accomplished through interconnecting processor 102-108, input/output (I/O) 138, and memory segments through multiple enhanced-GTL buses (hereinafter XBus) 110. As noted hereinabove, more processors may be interconnected with alternate CPU architectures. As shown, these multiple buses 110 form a subset configuration 136 (an XBus lattice) of a general cross-bar bus, where specific memory segments may be accessed through a dedicated bus.

In a preferred embodiment, the invention supports up to four memory segments 112-118. Each non-memory segment interfaces to all memory segments through dedicated address (XABus 140) and data (XDBus 142) bus-connection buses 120-134. In a preferred embodiment, each processor segment 100-108 may access all memory segments 112-118 through different access buses, and different segments 100-108 may post simultaneous accesses to different memory segments without interfering with one another. However, processor segments attempting to access the same memory segment must arbitrate for the bus leading to that memory segment. In this fashion, different memory segments remain highly available to different processor segments, and delayed access is reduced to occurrences of attempts to simultaneously access the same memory segment.

In a preferred embodiment of the invention, the XBus lattice 136 is a multiple bus cross-bar supporting the requirements of high-end processors in a multi-processor environment. XBus agents will accommodate Intel P6 class processors and agents, and P6 agents will abide by the Intel P6 External Bus Specification without alterations. XBus agents will abide by the XBus specification. P6 bus signals will generate XBus signals and transactions. Thus, a preferred embodiment will coerce a blending of the XBus protocol and P6 bus protocols.

A preferred embodiment also supports the MESI cache protocol, "read-and-invalidate" operations, and four sets of dual independent and cooperating buses 120-134. Each of the four sets 120-134, in addition to the requisite control signals, comprise a 36 bit address (XABus) 120, 124, 128, 132 bus and a 72 bit data (XDBus) 122, 126, 130, 134 bus. These buses support multiple outstanding transactions with out-of-order response support, and they may operate fully synchronously and may run at the same frequency as the CPU bus. A preferred embodiment will have the XABus 140 running at a minimum frequency of 66 MHZ, and the XDBus 142 at a minimum of 133 MHZ. A preferred embodiment operating at a preferred 133 MHZ supports source synchronous transmission of data on XDBus 142. An alternate preferred embodiment without source synchronization, operating at slower speeds such as 66 to 100 MHZ, may instead implement fewer XBuses and/or widen the data portion. For example, one such 100 MHZ embodiment may have only two XBuses and a data portion 144 bits wide. Data and clock for sampling the data are delivered by the responding agent in order to minimize transport delays and latency. This allows the data portion of the XDBus 142 to run at a much higher clock rate, yielding substantially increased bandwidth. This configuration allows for parallel distributed and overlapping arbitration, aggregate peak data transfer rate of 4.2 GBytes per second (133 MHZ transfer rate), aggregate peak transaction posting rate of 133 million per second, a low-voltage-swing open-drain GTL physical layer for support of the XBus protocol, and a high operating frequency. In a preferred embodiment, agents are also able to guarantee positive forward progress and avoid live-lock situations when multiple agents cross access dirty cache lines in each others cache. Preferably, error detection capability is available through support of parity on all buses, and ECC memory with single bit correction and double bit detection should be supported.

A preferred embodiment as described hereinabove thus has atomic transactions without bus locking, supports use of semaphores, transient error recovery through automatic retry of erroneous transactions (which preferably is logged and retrievable by the hardware abstraction layer (a component of the NT operating system)), and critical word first ordering.

Figure 2:
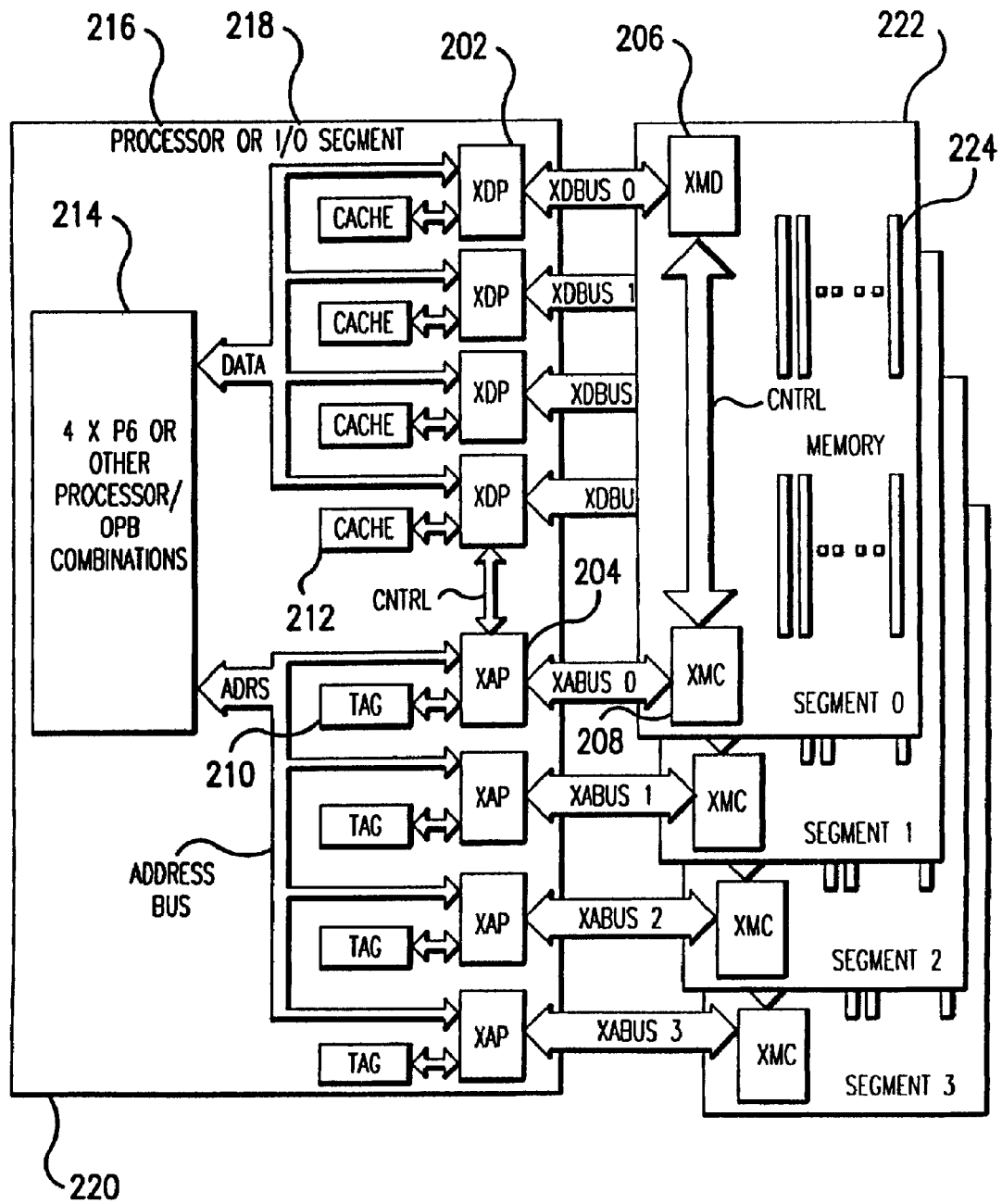
FIG. 2 is a schematic showing a preferred maximum server configuration of one embodiment of the invention.

FIG. 2 shows that in a preferred embodiment, the invention's architecture comprises two pairs of ASICs. One pair implements an interface between the XBus 110 and P6 buses (processor segment ASICs) while the other pair implements the memory control functions (memory segment ASICs) interfacing the XBus 110 to the memory arrays. The processor segment ASICs comprise a data path ASIC (XDP) 202 and an address path ASIC (XAP) 204. The memory segment ASICs comprise am XMD 206 a data path ASIC and an XMC 208 combination address/memory control ASIC. A preferred embodiment may contain one, two, or four XBuses 110, where each XBus has an independent memory segment with XMD 206 and XMC 208 which interfaces to dedicated XDPs 202 and XAPs 204 on non-memory segments.

Shown in FIG. 2 is the quad-XBus configuration. Each XBus 110 supports plugging circuit boards containing a segment into a midplane for that bus, resulting in four possible sets of segments. In the FIG. 2 embodiment, for each of the XBuses, there are three preferred segment types of segments that may be attached. The first segment type comprises the processor segment 216 having up to four P6 or equivalent processors 214, four XAP 204 and XDP 202 ASICs, tag RAMs 210, and four data caches 212 (with associated support logic). The second type comprises the I/O segment 218, having up to two P6 or equivalent processors, up to two Intel 82454GX controllers 214 (Intel's PCI bridge), four XAP 204 and XDP 202 ASICs, and tag RAMs 210 with their associated support logic. (Note that block 220 represents both the processor and I/O segments, and block 214 represents both the processors and Intel 82454GX controllers.) The third segments type comprises the memory segment 222, having a single XMD 206 and XMC 208, and up to one GByte of main memory 224 per segment. Depending on how memory is to be configured, up to four each of the XMCs 208 and XMDs 206 may be utilized on each segment to accommodate interchanging memory segments.

XAP

Preferred embodiments of the XAP 204 architecture have several major functions, which are as follows. One function is a programmable stride. Stride is defined as the number of contiguous cache lines that a XAP 204 will service. In effect, the stride acts as a modulo function for the entire memory address range. At boot time the XAP 204 responsible for a specific XBus 110 (FIG. 1) will be programmed with its stride. On single XBus 110 systems, the XAP 204 will be programmed to take responsibility for the entire address range, and therefore will have a stride of 4 GBytes. Systems with multiple XBuses 110 will have their XAPs 204 programmed such that each XAP 204 is responsible for a small number of contiguous cache lines. In a preferred embodiment, such a programmable stride is for allowing the optimization of memory access strategy with respect to a particular application environment. For example, in an environment having fine data set work, the XAPs 204 may be programmed for a stride of four cache lines. This will allow XAP-0 to launch transactions on XABus-0 for cache lines 0 through 3, XAP-1 to launch transactions on XABus-1 for cache lines 4 through 7, etc. Such a configuration increases the probability that subsequent memory accesses would be to different memory segments, thus allowing the avoidance of memory precharge delays or stalling due to another access pending at the desired memory location. Similarly, in a database environment having larger and often fixed size data records, the stride may be configured to contain an entire data record. Thus, when record searching, such a configuration increases the probability that subsequent memory accesses will be to different memory segments, once again allowing faster and somewhat overlapping memory accesses due to the potentially parallel nature of the memory configuration.

Another function is outgoing request queue management (XABus), which allows multiple simultaneous requests on an XABus 140 (FIG. 1). The XAP 204 will provide a queue for storage and management of its pending transactions until XABus 140 becomes available. Transactions may be posted to XABus 140 according to the XBus protocol. The XAP 204 will request ownership of its XABus 140 upon detecting a P6 bus cycle providing an address. The stride will determine which XAP 204 will take ownership of the transaction. Transactions are posted to the XABus 140 two clock cycles after they are posted to P6 bus if the XABus 140 is available and the outbound queue is empty. Alternatively, through an implementation of a mode switch, transactions may be delayed until the local segment's level 3 (L3) snoop result is delivered. This configuration would allow possible cancellation of the transaction prior to posting on the XABus 140, thereby decreasing the XBus 110 load. In this case, if the XABus 140 is available, transactions may be posted to the XABus 140 no later than three cycles after the address is asserted on the local P6 bus.

In a preferred embodiment utilizing the Intel P6 processor (or equivalent) and associated processor bus, the bus can have a maximum of 16 outstanding transactions (a maximum of 8 in-order and a maximum of 16 deferred). The XAP 204 will support these transactions concurrently. According to Intel's implementation of the P6 processor, a single P6 cannot post more than four transactions to the P6 bus. Preferred embodiments, whether utilizing the P6 or alternate processor, must support the maximum number of possible outstanding transactions.

Figure 10:
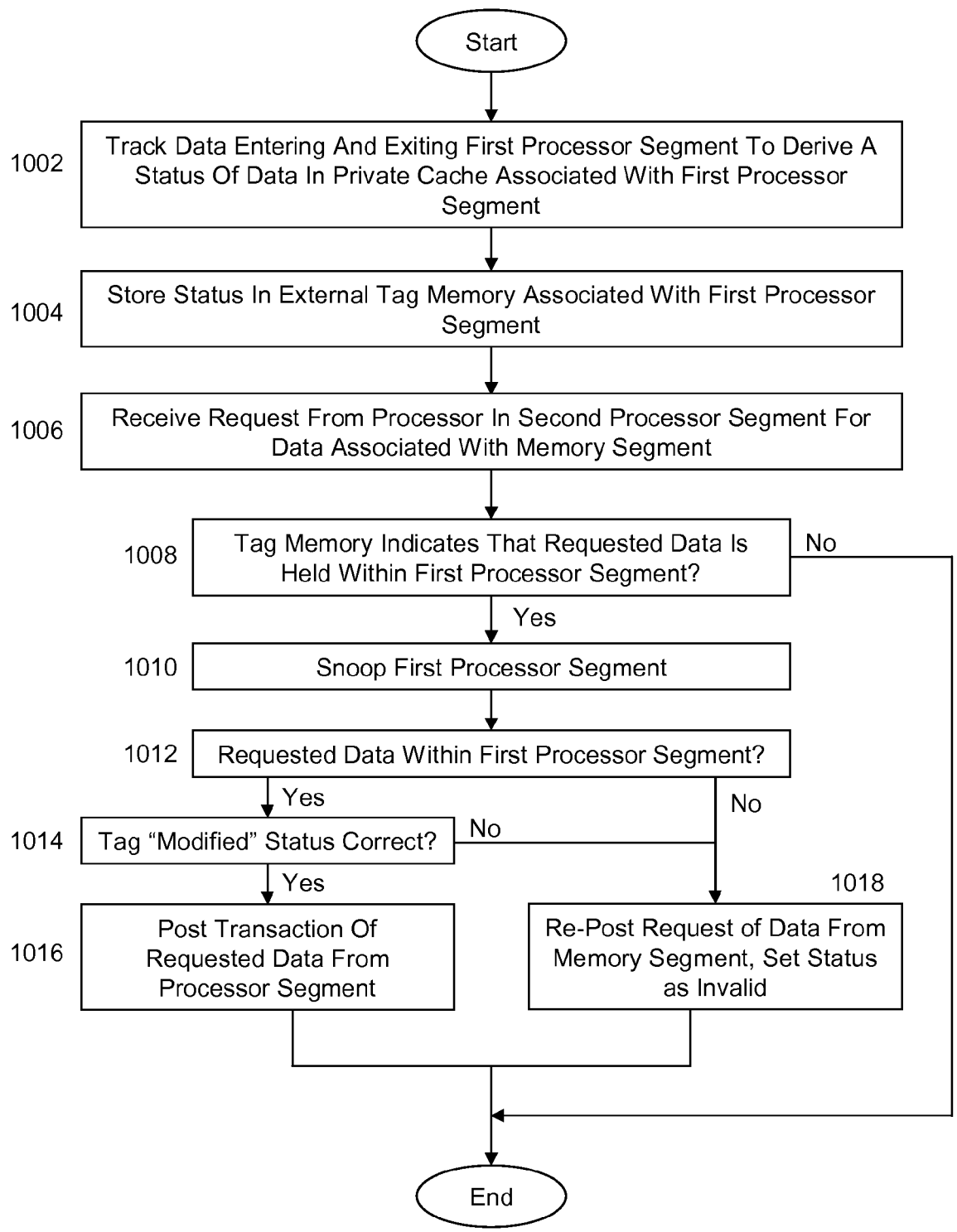
FIG. 10 is a flow chart illustrating a method for maintaining coherent data in a multiprocessor system in which tag memory may contain incorrect status of lines in private cache due to hidden updates of those lines in private cache.

In a preferred embodiment, the XAP 204 will become a cache line owner as soon as it posts an XABus 140 transaction for that cache line. This agent should provide appropriate snoop response if other agents access this cache line (see FIG. 10, steps 1006 and 1008). This agent may use the pending request type and the potential cache line state in providing a snoop response. If it is determined that the cache line will be modified by the first agent, it must then be provided to the P6 bus of that agent. Later, the XAP 204 on the first segment may run an appropriate cycle on its local P6 bus based on the pending request from the second agent to retrieve the requested cache line. The cache line is then provided to the second agent. This method may be chained such that no more that one additional request to an identical address is tracked by an XAP 204. Alternatively, the transaction from other agents may be retried on the XABus 140 by the agent that posted the first transaction. However, note that this action may degrade performance since the entire transaction on Xbus 110 and P6 bus will be resubmitted.

Another function is outgoing request queue snooping on the XABus which allows the XAP 204 to monitor XABus 140 requests posted by other segments. That is, the XAP will provide snoop results to the XABus 140 for the cache lines in its request queue and the local segment's cache. The snoop response will be reflected on the XABus 140 by no more than two clocks after it receives the posted address. The XAP 204 communicates to the XDP 202 the necessary information for completing any transaction that has resulted in a dirty hit in its outgoing request queue.

Another function is incoming request servicing which allows the XAP 204 to monitor every request on the XABus 140. The XAP 204 must service these requests when it detects that its segment has responsibility for the current XABus 140 posting. The XAP 204 will use the posted XABus 140 address to examine the contents of its local tag RAM 210. The XAP 204 must be capable of servicing priority requests from other XBus 110 or P6 bus agents. Preferably such incoming requests will be serviced ahead of other queued requests. The target XAP 204 communicates to its companion XDP 202 the priority nature of the incoming request.

Another function is communication with the XDP 202. The XAP 204 will provide information about its queued transaction to the XDP. The XDP 202 will use this information to determine if it is the target for XDBus 142 (FIG. 1) transactions. The XDP 202 may also use this information to lookup contents of its external cache 212. Contents of external cache are only used after determining that the contents are valid (with a tag RAM 210 hit). Queued transactions not posted to the XABus 140 will be removed from the XAP's 204 outbound queue if the cache contents are valid. If the transaction is posted to the XABus 140, then the XAP 204 must abort the ongoing memory access.

Figure 9:
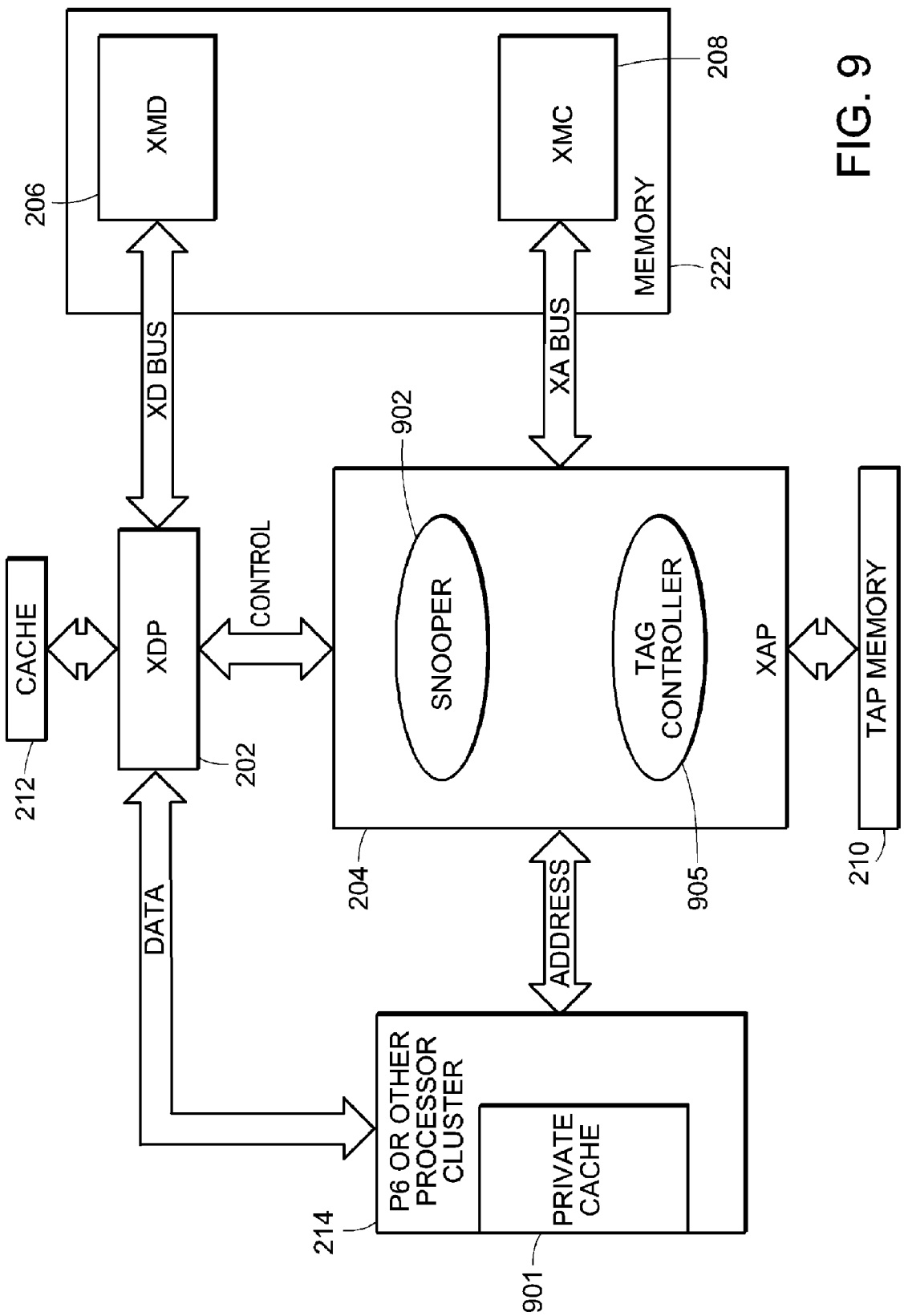
FIG. 9 is a schematic of an exemplary XAP showing cache controller functionality.
Figure 11:
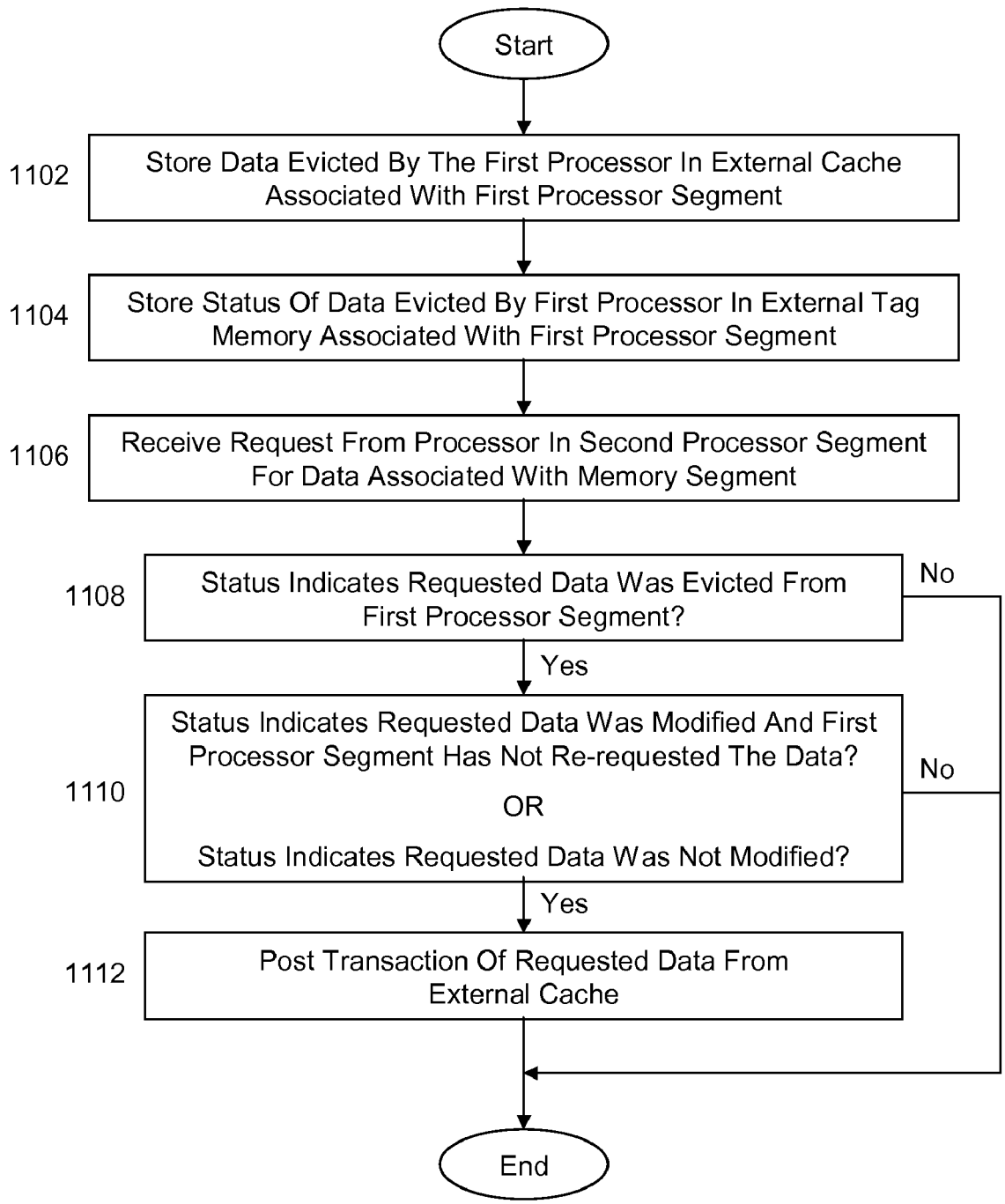
FIG. 11 is a flow chart illustrating a method for tracking and responding to requests for data that have been evicted from private cache.

Another function is cache management (FIG. 9). The XAP 204 must store the status of its local P6 caches 901 in its external tag RAM 210 (see FIG. 10, step 1004). The XAP 204 must manage contents of the cache 212 through the XDP 202. In a preferred embodiment, the external cache is a write back cache. The external cache 212 will contain, as a subset, a reflected copy of the local P6 cache contents. Preferably up to 64K cache lines are available in a single XBus 110 configuration. In addition, the cache 212 will include cache lines evicted by the local P6 processors (see FIG. 11, step 1102). The XAP 204, at a low priority and with available bus cycles on the local P6 bus, must determine if the status of the reflected cache lines are correct (shared copies are in the P6 cache); this process is defined as cache cleansing. A problem that a preferred embodiment addresses is that no Intel specification for the P6 processor discloses how to make public the contents of the level 2 (L2) cache 901 serving a processor cluster. No method is disclosed for determining which internal cache line is being replaced when a new one is fetched. And, it may be inferred from Intel disclosure that the Bus Read and Invalidate (BRIL) and Bus Invalidate Line (BIL) functions may or may not modify the requested line. That is, Intel disclosure indicates that the requests intend to modify the lines, but does not say they will; therefore the data associated with a requested line may still be maintained within a processor cache, and may not become stale unless the requested line is actually modified. Consequently, the invention needs to forcibly track the L2 cache's contents (see FIG. 10, step 1002). Towards this end, the XAP 204 tracks evicted P6 cache lines in producing a correct reflection of the P6 internal caches (see FIG. 11, step 1104). If external TAGs indicate that a line is in the modified state, then XAP 204 must not include that line as part of the cleansing process. Invalidate or Read and Invalidate instructions issued by a P6 do not guarantee that the cache line will be modified by that P6. External tag RAM 210 is managed by XAP. In a single processor segment configuration, the invention may function without tag RAMs. Such tracking of private cache contents is not unique to the Intel P6 processor, and such tracking by the invention is applicable to any other processor that hides such information.

Preferred embodiments should allow false HITM support for the XBus. (The HITM is a cache buffer holding a cache line from an external inquiry that results in a cache hit. Asserting HITM results in receiving cache writeback data.) It is possible, in a multiple segment system without a L3 cache, for the XAP 204 to assert HITM in response to an XABus 140 transaction. This would occur when a P6 is provided a cache line in the Exclusive state but that P6 has not modified the line or will not modify the line. This again is due to the lack of information regarding the state of internal cache lines; thus one must assume that once a line is read with intent to modify, it must then be treated by the tag RAMs as potentially dirty and that a machine with speculative execution may prefetch the data and not modify it. In such a case the XAP's 204 snoop phase will result in no write-back data on the P6 bus. If a XAP 204 has determined that it asserted a HITM condition erroneously, it will resubmit the original transaction on the XABus 140 (see FIG. 10, steps 1012, 1014, 1018). A preferred embodiment will have a predetermined address for doing so. The appropriate memory segment may determine from the new transaction that a false HITM condition exists and must therefore supply the cache line. The XAP 204 asserting the false HITM must set the tag for this cache line to "Invalid."

Note that a copy of modified cache lines that have not been evicted by local P6 processors may nonetheless be stale. Only evicted cache lines that have not been re-requested by the local P6 processors in an Exclusive state may be provided to other segments without running a Read, or Read and Invalidate transaction on the local P6 bus (see FIG. 11, steps 1106-1112). A preferred embodiment will force P6 processors to store cache lines in a shared state. This in turn forces processors to post an Invalidate transaction if it requires to modify shared cache lines. In this manner, the external tag RAM 210/XAP 204 will be able to track modified lines. If lines were allowed to exist in an Exclusive state, then the P6 is allowed to modify the cache line without running any P6 bus cycles. This would force the XAP 204 to perform a Read transaction on its local segment to determine the true state of the cache line, a time consuming operation that a preferred embodiment of the invention seeks to avoid.

The XAP 204 will post requests on the P6 bus as a priority agent for retrieving dirty cache lines requested by other segments. Dirty data must be returned to the requesting agent on XDBus 142 via a high priority request. Request for returning dirty data must be pipelined with other transactions on the bus without unnecessary dead cycles. Responding segments that intend to provide write-back data must also provide an associated latency for providing that data. This latency is provided for dirty lines in both L2 and L3 caches. The requesting segments may compare this latency to an internal approximation of when the dirty cache line is to be provided to their local P6 bus. Based on this comparison, the requesting segment may decide to defer the transaction or keep it in its in-order queue. Requesting segments that receive a snoop response indicating write-back from a remote processor segment's L2 cache may only keep such a transaction in their in-order queue if they are not responsible for write-back data from their L2 due to an earlier transaction.

The status flags in the tag RAM 210 will allow XAP 204 to determine if it must respond to the posted transaction. P6 processors on a segment will be forced to store all cache lines according to MESI protocol unless they specifically execute a Read and Invalidate or an Invalidate against that cache line. In this case the P6 posting the transaction will be allowed to store an Exclusive copy. Tag RAMs 210 must carry flags associated with the local P6 cache flags (MESI), as well as an ES and MF flag. The ES flag, for "exclusive to this segment," indicates that a cache line may be stored in a P6 cache as shared while the local XAP 204 identifies itself as the exclusive owner. The MF flag, for "modified and flushed," indicates that the cache line that was stored by a P6 as Exclusive was later evicted. This also means that the local P6 segment has not re-requested this line.

Another function is write transactions to dirty lines. In a preferred embodiment, write-line transactions posted on XABus 140 with a write-back request that result in a dirty hit (via HITM) must log an error signal for diagnostic purposes.

Another function is semaphore support. The XAP 204 must support locked transactions without locking out other XBus 110 agents from using the bus or locking the processor bus of remote segments. Local XAPs 204 must keep track of locked addresses. XBus 110 accesses intruding on a locked/guarded address will receive a RETRY response to their posting on the XABus 140. The XAP 204 must also insure forward progress and secure access to any P6 executing a locked transaction. Transactions against locked memory locations receive a RETRY response on the local P6 segment while the XAP 204 accesses remote data. This allows other P6s on the issuing segment to proceed. The issuing XAP 204 will not allow access to locked cache lines by another XAP. Such accesses must be retried on the XBus 110 until the lock is removed. Multiple locked transactions may be pending as long as the locks are for different cache lines.

Agents with outstanding split locked transaction must assert RETRY on the XBus 110 if another agent attempts to access their locked cache line(s). Only cache lines that have successfully passed their snoop phase on the XABus 140 may be guarded by the XAP 204 issuing the split locked transaction (multiple XBuses are involved).

The agents with outstanding split locked transactions crossing page boundaries must force a RETRY on the XBus 110 if another agent attempts to post a split locked transaction that crosses page boundaries. In a preferred embodiment, only a single split locked transaction crossing page boundaries is allowed on all XBuses within a system. Other agents will be able to post a new split locked transaction crossing page boundaries as soon as the snoop phase for the second read access of the posted locked transaction (crossing page boundaries) is completed on XBus or the Lock on the issuing segment's bus is removed. Agents may post split locked or simple locked transactions on XBus while a split locked transaction crossing page boundaries is pending.

Another function is P6 delayed snoop cycle management. The XAP 204 will queue transactions from local P6 segments until they may be posted to XABus 140. The XAP 204 must manage and minimize snoop response delays on its P6 bus.

According to the Intel specification, the P6 bus requires a snoop results within four cycles after assertion of ADS on the P6 bus. In a multiple segment configuration, a HITM on XABus 140 will result in a deferral of the transaction on the issuing segment. In order to accomplish this, the issuing segment's snoop cycle must be delayed by 2 clocks to accommodate snoop results from XABus 140. Only HITM on the XABus 140 will result in a P6 bus transaction deferral. In an embodiment having only a single segment, this feature is not necessary, since all snoops take place on the local P6 bus. In this limited configuration there will be no delay of the snoop phase. The agent asserting HITM will provide the data. Deferral and snoop phase delay features may be boot time programmable. In a preferred embodiment, L3 cache hits will not cause snoop phase delays. Note that snoop phase may be delayed due to previous transactions that resulted with no L3 hit.

Another function is I/O read access deferral. Response to read accesses posted against I/O address space must be deferred by the local XAP 204. Such deferrals will allow other CPUs on the issuing segment to proceed while the read data is being retrieved. The XAP 204 will provide for disabling deferrals for embodiments with a single processor segment which and local PCI bridge.

Another function is minimized pipeline delays. The XAP 204 must minimize pipeline delays for posting transactions to the P6 bus or XABus 140. Time critical information must be provided with no more than a single register delay. Each XAP 204 will preferably provide a complete 36 bit address bus on both XABus 140 and P6 bus. In preferred embodiments of the invention, the XABus 140 input or output will operate at 66 to 75 MHZ using a synchronous clock. Recall, as discussed hereinabove, that the speed limitations are due to the limitations of the P6 architecture, and may not be applicable to other processor architectures. The P6 bus input or output will therefore preferably operate at 66 to 75 MHZ using the same synchronous clock. The XAP 204 will may use round robin arbitration to acquire the XABus 140 or P6 bus. P6 bus arbitration will be based on P6 bus specifications. XABus 140 arbitration will be based on the following scheme: at reset, the agents will assume a predetermined priority based on their agent ID code. In a preferred embodiment of the invention, this will be mid-plane position-dependent valuation. After reset, the agent that wins mastery of the XABus 140 will become the lowest priority. All remaining agents will move up in priority. An agent that has not arbitrated for the bus over a long period of time, when the remaining agents have become bus masters, will be the highest priority agent. The XAP 204 may keep ownership of the XABus 140 if no other agent is requesting ownership and it has outstanding transactions in its outgoing queue. Transaction posting on the XABus 140 may consume two cycles. Except for arbitration signals, new agents must insure a dead cycle on the XABus 140 prior to asserting their signals.

Another function is I/O address mapping. The XAP 204 will service PCI bridges. It must therefore detect bus activity on the XBus 110 and the P6 bus associated with such bridges.

Another function is system Management Mode support. Agents generate SMI Acknowledgments on the XBus when a P6 CPU on their segment enter the System Management Mode handler. A second SMI Acknowledgment exits the processor from the handler. The XAP 204 must ensure that only local P6 processors in System Management Mode issue write transactions to the System Management Memory address space. Access to any other portion of memory is unrestricted. The agent will indicate that the current access is for the System Management address space (SMMEM). This will insure that faulty processors will not disturb this address space. If System Management Mode is not entered or exited properly and a write transaction is posted to XBus, then that transaction must be aborted (ABORT) and the XBus 110 segment (XAP 204/XDP 202) will submit a Hard Error Response to its P6 bus. If the request is queued and not posted on the XBus, then it must be removed from the queue and a Hard Error Response must be returned to its P6 bus. In a preferred embodiment, XAP 204 conforms to the XBus protocol.

XDP

Preferred embodiments of the XDP 202 architecture have several major functions, which are as follows. A first function is incoming data queue management. The XAP 204 provides information to XDP 202 regarding transactions that it is expected to retrieve from XDBus 142 (FIG. 1) for the local segment. The XDP 202 must retrieve these transactions and post them to the local P6 segment. If immediate posting is not possible, it must enter such responses into a queue until the correct time slot on P6 bus is reached. The P6 bus requires in order response while XBus 110 provides out-of-order response. The XDP 202 will manage transaction ordering between the two buses. The XAP 204 will communicate with its companion XDP 202 concerning priority incoming data. Such data will be provided on the P6 bus as a priority agent. This incoming priority data will be placed ahead of any other in the incoming queue.

Another function is Data Cache management. The XDP 202 must retrieve cache lines from the L3 data cache and present them to the local P6 segment if the XAP 204 has determined that the cache entry is valid. The XDP 202 must also provide cache lines to XDBus 142 under direction of XAP 204.

Another function is write transactions to dirty lines. Write-byte transactions posted on the XABus 140 that have resulted in a dirty hit (via HITM) cause both segments, the requesting segment, and the one asserting the HITM, to provide their respective cache lines on the XDBus 142. Each segment must identify their cache line, whether WPL or write-back, in their respective XDBus 142 transaction. In this case, the memory subsystem is responsible for combining the incoming cache lines.

Another function is minimized pipeline delays. The XDP 202 must minimize pipeline delays for posting transactions to the P6 bus or XDBus 142. Time critical information must be provided with no more than a single register delay.

Another function is outgoing data queue management. Transactions may be queued or posted to XDBus as soon as data is delivered from the local P6 segment. The XDP 202 will provide a low priority to cache eviction postings from its local segment or its external cache. Memory reference postings and dirty cache line write back due to assertion of HITM by this segment must have a high priority. The XDP 202 must manage XBus utilization in a manner so as to not stall its local segment due to cache eviction. The XDP 202 will arbitrate for the XDBus 142 as a priority agent for priority outgoing cache lines as instructed by its companion XAP. Each XDP 202 provides a complete 72 bit data bus on both XDBus 142 and P6 bus. The XDBus 142 input or output will preferably operate at 133 to 150 MHZ using a source synchronous clock. The P6 bus input or output will preferably operate at 66 to 75 MHZ. However, as discussed hereinabove, an alternate embodiment may operate at 100 MHZ (or slower) with an appropriate modification to the width of the data bus.

Another function is Arbitration and Priority. The XDP 202 may use round robin arbitration to acquire the XDBus 142 or P6 bus. P6 bus arbitration will be based on the Pentium Pro bus specifications. In a preferred embodiment, an appropriate signal is asserted on the P6 bus, but arbitration between the XDP's is performed independent of the Pentium Pro bus protocol. XDBus 142 arbitration will be based on the following scheme: at reset, the agents will assume a predetermined priority based on their agent ID code (mid plane position dependent). After rest, the agent that wins mastery of the XDBus 142 will become the lowest priority. All remaining agents will move up in priority. An agent that has not arbitrated for the bus over a long period of time, when the remaining agents have become bus masters, will be the highest priority agent. The XDP 202 may keep ownership of XDBus 142 if no other agent is requesting ownership and it has outstanding transactions in its outgoing queue. Transaction posting on XDBus 142 may consume three cycles excluding the arbitration phase. New agents must insure a dead cycle on the XDBus 142 prior to asserting their signals (except arbitration signals).

Another function is transaction status. Each transaction must receive a response within a predetermined time period. This period is referred to as transaction time-out period and it must be programmable at boot time. The XMD 206 must assert report occurrence of an unrecoverable error (UERR) if a transaction does not receive a response within the time-out period.

Another function is semaphore support. The XDP 202 will provide storage for at least two locked/guarded cache lines. The issuing P6 on the local segment will be allowed to proceed with a locked transaction only if the addressed cache line has been retrieved by the XDP 202. The XDP 202 must inform XAP when guarded cache lines are delivered. The XAP 204 will then allow the local P6 to proceed with its transaction by not retrying P6's request to post the locked transaction.

Another function is ECC support. The XDP 202 must be capable of detecting ECC errors on all data delivered or received from the XDBus 142. The XDP 202 will effect its internal status register upon detecting multiple bit ECC errors. This information will be used to isolate faulty portions of the system. Data delivered to The XDP 202 for transactions that are on top of its in order queue may not have sufficient time to be checked prior to delivery to P6 bus. In this case the XDP 202 may deliver the data and defer the ECC check until after delivery. Under such a condition, the P6 bus may receive a normal data response even though the delivered data has a multiple bit error. Deferred checking of the delivered data will help isolate the faulty subsystem. The P6 will detect the ECC error due to its internal check mechanism. If the data is delivered to the XDP 202 from the XDBus 142 with a hard error response, then the same response is to be delivered to the P6 bus. All data queued by the XDP 202 for delivery to the P6 bus at a later time will have sufficient time for ECC checking. In this case a hard error response must be delivered to the P6 bus when a multiple bit error is detected. In a preferred embodiment, the XDP 202 conforms to the XBus protocol.

XMC

Preferred embodiment, the XMC 208 has several major functions as follows. The first is incoming queue management. The controller must examine each address against idle banks of memory. In an effort to keep all banks busy, accesses against idle banks must be given priority even though other requests may be in front of the queue. The XMC 208 will must support servicing of priority requests for read operations. The XMC 208 will give high priority to read operations. Write operations will be managed in a predetermined manner that will not cause XBus write stalls due to full queues.

Another function is cache line pre-fetch. Read requests for a complete cache line will result in the read of that cache line plus the read for the next cache line. The next cache line is read in advance of an actual request only if a request is not pending against the bank containing the next cache line. The next cache line is placed in a line buffer in the XMD 206 awaiting potential arrival of a request for the second line. When a pre-fetched request for the cache line actually arrives, the XMC 208 will signal the XMD 206 to queue the line for posting onto the XDBus 142. At the same time the next sequential line will be pre-fetched from memory. In a preferred embodiment, the XMC 208 will provide a mechanism to re-use locations in the pre-fetch buffer that are occupied by old pre-fetched lines.

Another function is interleaving. The XMC 208 may simultaneously service as many memory banks as are present within a host computer architecture. In one preferred embodiment, the XMC services four independent memory banks, each bank utilizing SDRAMs, which have an additional two or four banks (16 MBit/64 MBit technology). This preferred configuration will provide as many as 16 (64 MBit technology) banks per XMC 208. The XMC 208, through a snoop capability, must be able to abort transactions to modified cache lines or to cache lines where data will be provided from the local cache. Cache line pre-fetch will not take place if a cache line access is aborted. The XMC 208 must be capable of supporting snarf operations from XDBus 142 as a result of a dirty cache line hit.

Another function is XMD 206 support. In a preferred embodiment, the XMC 208 will communicate to the XMD 206 the status of ongoing transactions through a private bi-directional bus.

Another function is write transactions to dirty lines. The XMC 208 must direct the XMD 206 to store (in a temporary buffer) dirty line data associated with a write-byte transaction. It must also direct the XMD 206 to combine the dirty line with the write-byte data when it arrives. The XMC 208, after the lines have been combined, may then write the resulting cache line into the memory. The memory is the owner of the cache line after the original write-byte transaction has been posted. The memory will not respond to a subsequent read request for that cache line until the write-byte data has been combined.

Another function is ECC support. The XMC 208 must support ECC operations provided in XMD 206. In case of ECC, the corrected data must be written back into memory and provided on the XDBus 142. The Data valid signal must not be asserted in case of an ECC error in the current line. The XMC 208 will support parity as provided for XABus 140 control signals. XABus 140 transactions which include parity errors must result in a re-posting of the erroneous transaction.

Another function is self-snooping write queue. The XMC 208 must guarantee read data delivery from the write queue in case of an address match between the write queue and the read operation. Data should not be provided on XDBus 142 until the snoop cycle (the pre-fetch) for a read transaction has been completed.

Another function is Memory Scrubbing. The XMC 208 will support memory scrubbing to insure data integrity. This may be implemented as a low priority task, and may be performed in conjunction with the memory refresh function. This function may require memory initialization at power up.

Another function is False HITM support. The XMC 208 must support the False HITM condition by changing the write back condition for a cache line to a read condition and providing the result through the XMD 206 on the XDBus 142. The XMC 208 will receive indication of such a condition through a second posting of an original transaction on XABus 140. Such postings will be made at a predetermined address. It is possible that a False HITM may occur during a partial cache line write operation (WPL). In such cases, the XMC 208 will first cause a read of the cache line, allowing the XDP to combine it with WPL data when it arrives, and writing the result into its final destination. In a preferred embodiment, the XMC 208 will conform to XBus protocol.

XMD

Preferred embodiment, the XMC 208 has several major functions as follows. The first is write queue. The XMD 206 must contain a write queue capable of supporting a large number of transactions. The queue must be sufficiently large so as to not cause XBus write stalls. Write data will be written into main memory at a lower priority. Incoming data must be ECC checked prior to writing the data into memory. The write queue must be self snooping, and the XMC 208 must guarantee read data delivery from the write queue in case of an address match between the write queue and the read operation.

Another function is read queue. The XMD 206 must support a read queue capable of supporting a large number of transactions. Up to four segments may be posting read requests to the XAP 204 while a single XMD 206 will respond to all posted transactions. Outgoing data must be ECC checked prior to assertion of data valid signal (DS). If an error is detected, then such data may be provided on the bus, but data valid may not be asserted. For diagnostics purposes only, the XMD 206 will provide a mechanism that allows faulty data returns with assertion of a data valid signal. Priority requests on the XABus 140 should result in priority response on XDBus 142. Such responses will must take priority in the front of the outgoing queue.

Another function is cache line pre-fetch buffer. The XMD 206 must support a buffer for supporting a large number of pre-fetched cache lines. The XMC 208 will indicate to the XMD 206 which pre-fetched buffer location should be queued for posting.

Another function is write transactions to dirty lines. Write-byte transactions posted on the XABus 140 that have resulted in a dirty hit (via HITM) cause both segments, the requesting segment and the one asserting HITM, to provide their respective cache lines on XDBus 142. Each segment must identify their cache line (WPL or write-back) in their respective XDBus 142 transaction. In this case the memory subsystem is responsible for combining the incoming cache lines. The memory is the owner of the cache line after the original write-byte transaction has been posted. The memory must not respond to a subsequent read request for that cache line until the write-byte data has been combined. In case of a false HITM, the memory subsystem will combine the WPL data with the addressed cache line.

Another function is XMC 208 support. In a preferred embodiment, the XMD 206 will communicate with the XMC 208 regarding ongoing transactions.

Another function is that the XMD 206 must become a priority agent on XDBus 142 for returning read data if its return buffer is nearly full. This will momentarily force posted writes on XDBus 142 to become low priority and reduce read return latency. The XMD 206 will use round robin arbitration to acquire the XDBus 142 based on the following scheme: at reset, the agents will assume a predetermined priority based on their agent ID code. In preferred embodiments of the invention, this will be mid plane position dependent valuation. After rest, the agent that wins mastery of the XDBus 142 will become the lowest priority. All remaining agents will move up in priority. An agent that has not arbitrated for the bus over a long period of time, when the remaining agents have become bus masters, will be the highest priority agent. The XDP may keep ownership of the XDBus 142 if no other agent is requesting ownership and it has outstanding transactions in its outgoing queue. Transaction posting on the XDBus 142 will consume three cycles excluding the arbitration phase. Except for arbitration signals, new agents must ensure a dead cycle on the XDBus 142 prior to asserting their signals. This arbitration method shows all device requests to all device on the bus, and all devices then simultaneously apply (i.e. in parallel) the same arbitration method to determine if it won the arbitration contest. In this fashion all devices know arbitration results without extra time taken to notify them.

Another function is false HITM support. The XMD 206 must support False HITM condition as required by its companion XMC 208. See also hereinabove regarding False HITM.

Another function is ECC support. The XMD 206 is responsible for ECC checking all data it delivers or receives to/from the XDBus 142. The XMD 206 must set internal status registers and record the error. When delivering data to the XDBus 142, the XMD 206 may not have sufficient time to provide the correct response type (normal/hard error) if a multiple bit ECC is detected in the last 16 bytes of the cache line and the cache line is required for immediate delivery to XDBus 142. In this case XMD 206 will continue to deliver the cache line. The XMD 206 is responsible for indicating a hard error response on the XDBus 142 if a multiple bit error is detected in the first 16 bytes of data that is to be delivered to the XDBus 142. The XMD 206 is also responsible for providing a hard error response on the XDBus 142 for all cache lines that contain a multiple bit ECC error and are queued for delivery at a later time.

Tagging and Caching

Intel's P6 processors contain four way set associative cache subsystems. A fundamental problem that a preferred embodiment addresses is that the cache controller does not provide external information regarding the cache lines it is replacing. An external device can attempt to run snoop cycles on the P6 bus to determine which cache lines are being replaced, but this is very inefficient and requires creating a large number of transactions on a P6 bus just for this purpose.

In order to minimize snoop cycles on the P6 bus, while also maintaining coherency in preferred embodiments, the following facilities are provided by the tag controller 905, as shown in FIG. 9. The first is that a large external tag be able to accommodate up to 16 to 32 times the number of cache lines that may be stored by a single quad-CPU processor segment.

Another is that the CPUs will not be allowed to store cache lines in the Exclusive state unless they specifically execute an Invalidate or Read and Invalidate cycle. As long as lines are stored in a shared state, there will be no immediate need to run snoop cycles on the P6 bus to determine the actual state of the line being requested by another Segment.

Another is that local TAGs store sufficient information to indicate if a segment is an Exclusive owner of a cache line, even if the CPU is forced to store the cache line in the Shared state. The tag controller 905 will monitor write cycles initiated by the P6 to determine which dirty cache lines are being evicted.

Another is that the tag controller 905 will declare ownership of cache lines via assertion of HITM on the XABus 140 that a P6 on another segment has requested. If such declaration is made, then the tag controller will post an appropriate cycle on the local P6 segment (or preferably retrieve the line from the external cache if it has been previously evicted) and provide to the Xbus (see FIG. 10, steps 1012-1016). Another is that the tag controller 905 will perform snooper 902 function which sequentially scans the tag RAM for shared cache lines and, at a low priority, when P6 bus is idle, will run snoop cycles to determine if the line is currently present (tag cleansing). Modified lines will not be snooped for cleansing purposes. Preferably, external tag depth will be limited to 256K or 512K cache lines per XBus 110 (FIG. 1) connection. Systems with a single processor segment will be able to function without external tag.

An external cache 212 may be added to remedy two known problems. The first is that local processors are not guaranteed to evenly distribute transactions among XBuses within a system. (This is not a problem unique to Intel processors.) Processor transactions may target the same bus repeatedly causing bus congestion on one XBus while another is predominantly free. Responses to transactions posted against nearly idle buses will be provided sooner than transactions posted against congested buses. Due to the in-order requirement, such early responses may not be used until the response to the previously posted transactions are provided. In addition one must consider that multiple segments will be posting transactions against all XBuses. This will cause further delay in responses to this segment. Such a condition will force processor stalls due to lack of data.

The second is that processor caches may be relatively small (with respect to data set size and application being executed), making it very likely that cache lines are frequently replaced. The invention's P6s will have to compete with large number of other CPUs for memory references. This may delay delivery of data and cause processor stall.

Through using a local cache, some responses will be provided locally and faster than retrieval from main memory. For P6 processors, all transactions are always posted to the XBus 110 unless the posting is delayed through queue management in the outbound queue, and the XAP 204 determines that the local cache contents are valid. Local cache responses will allow termination of posted memory references thereby off loading the XBus for servicing other processors. Although TAG ram is required for maintaining cache coherency as described hereinabove, the external cache ram is an option for improving system performance. In preferred embodiments of the invention, external cache contents will be inclusive of L2/L1 contents. External cache depth per XBus connection may be limited to 8 to 16 MBytes per segment, or 32 to 64 MBytes per segment in a fully configured FIG. 2 type of system.

Figure 3:
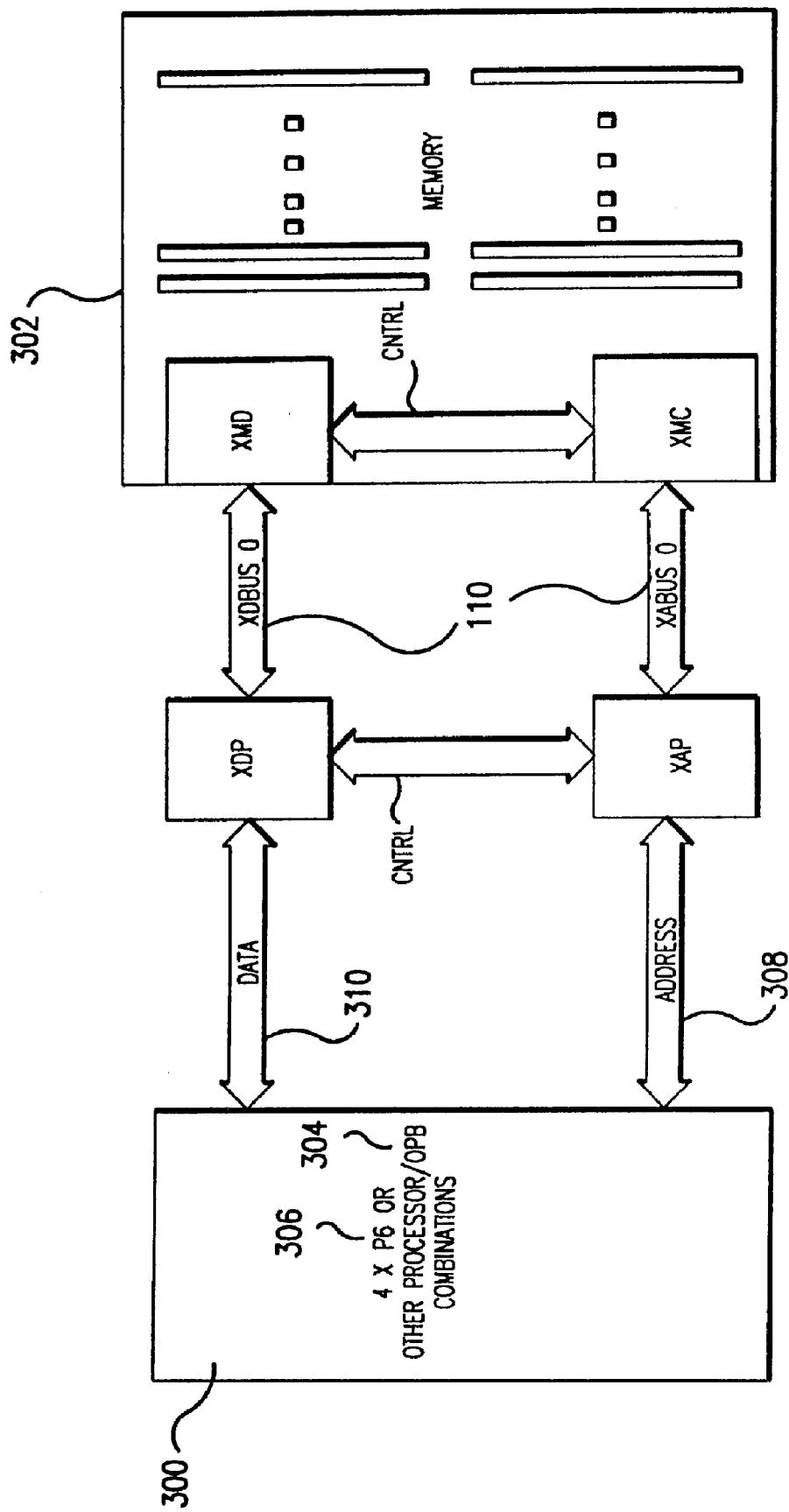
FIG. 3 is a schematic showing a preferred minimum desktop configuration, of one embodiment of the invention.

FIG. 3 shows a preferred minimum desktop configuration. Such a configuration would contain one of each type of ASIC. That is, in this embodiment, there is a processor segment 300, a single XBus 110 (shown on FIG. 1) for address 308 and data 310, and a single memory segment 302. I/O capability may be added to this embodiment by adding Intel 82454GX controllers 304 directly to the P6 bus. This embodiment is expected to have at most four P6 processors and two PCI bridges, with support of up to one GByte of memory 302. A somewhat more advanced configuration could be achieved by providing two XBuses 110 and eight to ten processors 306 along with an I/O Segment (not shown).

Figure 4:
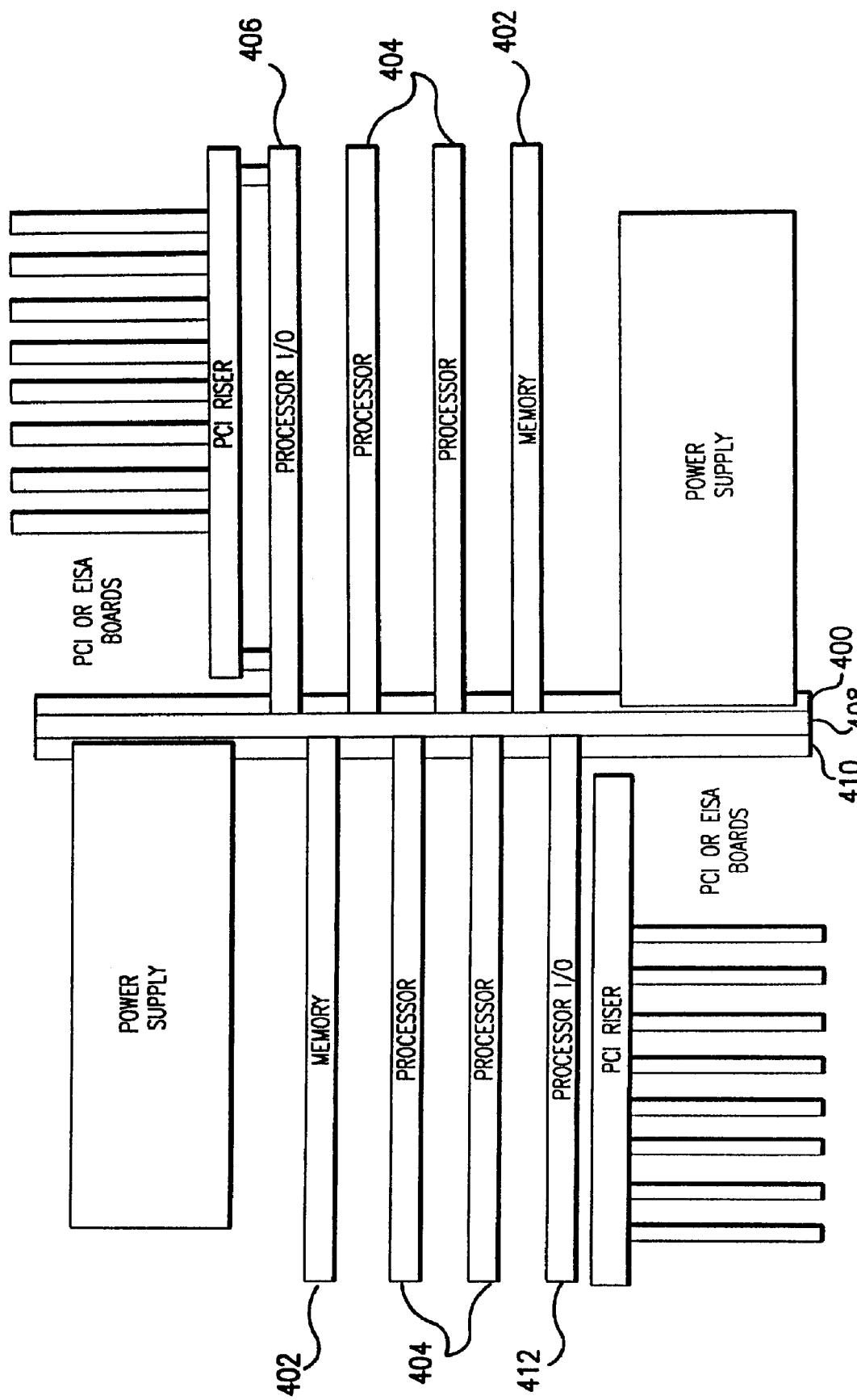
FIG. 4 is a schematic showing a XBus physical configuration according to the present invention.

FIG. 4 shows that in a preferred embodiment, the XBus 110 (shown in FIG. 1) is expected to be implemented on a two sided midplane 400, where installed within the computer are two memory segments 402, five processor segments 404, 412, and one I/O Segment 406. In an alternate embodiment, a second I/O processor may be substituted for processor 412. In FIG. 4, each memory segment 402 services two XBuses 408, 410. Each board connects to the midplane with several low inductance connectors. During operation of the invention, a P6 CPU on a processor segment will post a transaction to an XBus 408, 410 as soon as it acquires the local P6 bus and starts the P6 bus Request Phase. This action is monitored by all XAPs 204 (FIG. 2) on that segment. One of the XAPs 204 will route this transaction to an XABus 140 (FIG. 1). Since a system may have one or more XBuses, at boot time, each XAP 204 and XMC 208 (FIG. 2) will be configured to respond to certain addresses.

XAPs 204/ XMCs 208 on the same bus but belonging to other segments are continually monitoring XABuses 140 (FIG. 1) for transactions. Target segment(s) will initiate appropriate action on their segment in order to respond to the posted XABus 140 request. The target segment, when the response is available, will post the response to XDBus 142 (FIG. 1) through its XDP 202/XMD 206. The XDPs/XMDs for all segments are continually monitoring XDBuses 142 for responses that may belong to their local segment. The XDP/XMD will provide such a response to the local P6 bus/ memory for that segment. The XAP 204/XMC 208 communicates launched transaction information to the local segment's XDP 202/XMD 206. This will include critical information such as transaction ID, expected response, portions of address needed for concurrent local external cache look-up, etc. This will enable XDPs/XMD to properly route XDBus 142 postings. If a valid cache line is currently stored in the cache, a bus' data cache 212 (FIG. 2) may intervene on behalf of the memory and locally provide data.

Board Layout

The following sections illustrate board layouts that may be used in high-end and mid size servers. In some embodiments of the invention, the XBus and its associated ASICs may reside on the mother board, a no mid-plane design. Such a configuration may reduce packaging size for these products. Embodiments configured with mother boards may cost more, and force customers to purchase more complete products up front, as all ASICs will be on the mother board and the P6 CPUs will become the main option. The invention's midplane based products will allow customers to purchase a minimum chassis and then configure their product over time.

Figure 5:
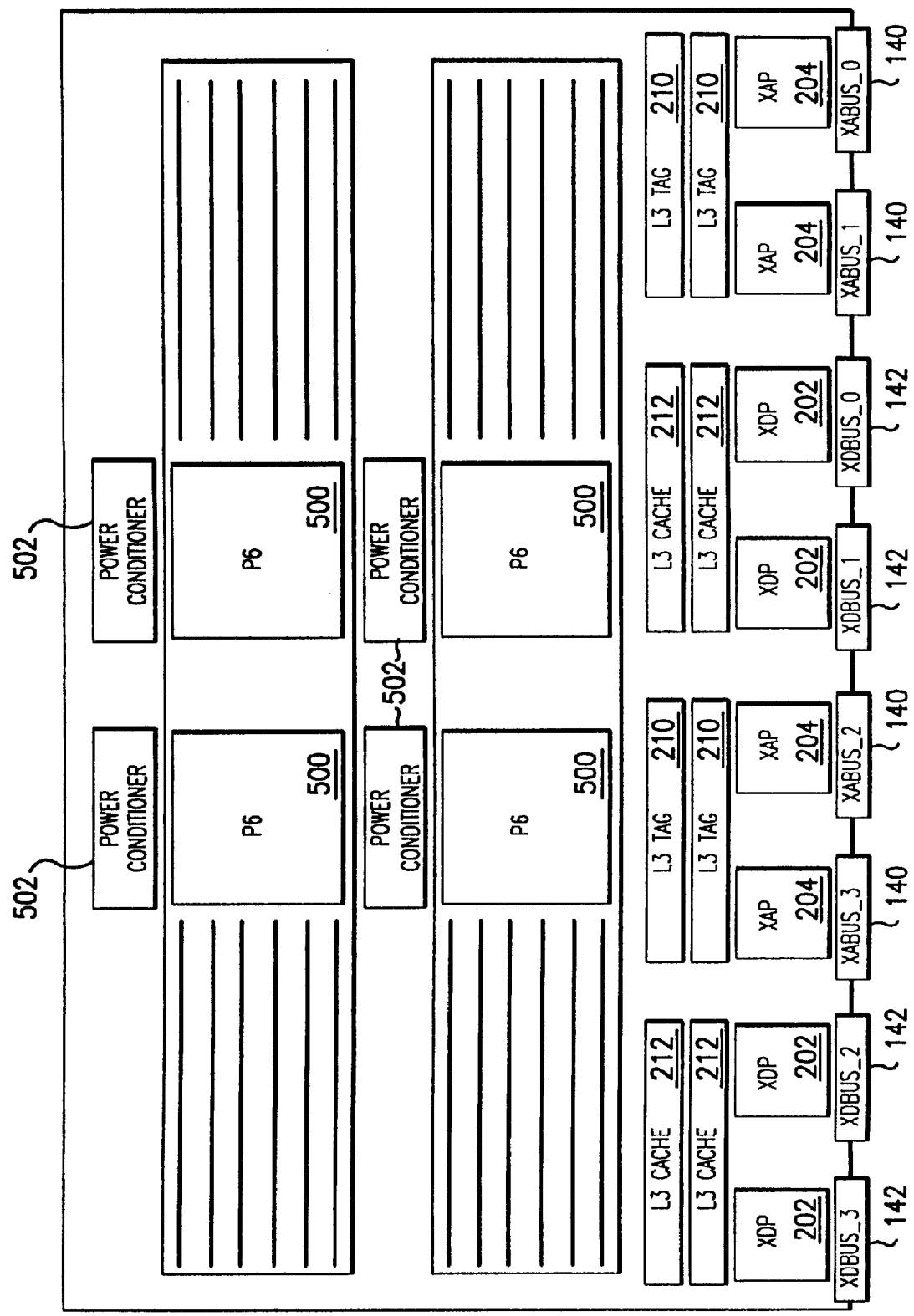
FIG. 5 is a schematic showing a quad XBus processor segment of one embodiment of the invention.

FIG. 5 shows the processor segments in a preferred embodiment of the four XBus system configuration. This embodiment has SMT straddle mounted connectors for XABus 140 and XDBus 142. Immediately above each connector will be a data path 202 or address path 204 ASIC. Preferably the connection length between the ASIC and the connectors is minimized, and preferred embodiments will utilize stub connections. Further, each side of the ASIC must be used for a specific interface: XBus (XDP 202/XAP 204), tag 210 or cache 212, P6 bus, and XAP 204 or XDP 204 interconnect.

The tag RAM 210 is fast access, preferably 5-8 n sec, static RAMs mounted on a SIMM or its equivalent (e.g. DIMM). The SIMM will house as many as twelve RAMs for tracking 512 K cache lines. A preferred minimum tag configuration will contain six RAMs on one side of the SIMM for tracking 256 K cache lines. The tag RAMs are not optional and one of the two possible options must be resident. In order to enable a high speed design, each SIMM will service only one XAP. A more complex embodiment may be configured with 1,024K cache lines per XBus, through use of higher density RAM technology.

In a preferred embodiment, the L3 Cache 212 will be designed around SDRAM technology to allow fast cache burst access. The SDRAMs will be mounted on a SIMM and provide a 72 bit data path. Due to available memory size, the SIMMs may contain as much as 1,024K cache lines. TAGs presently track only up to 512K cache lines. As TAGs are a critical component of the system, every effort is made to minimize cache line access time.

Each processor segment will preferably house up to four CPUs 500 and associated power conditioning circuitry 502. Although preferred embodiments of the invention will utilize CPUs with a low profile heat sink that extends beyond the CPUs, other embodiments may use heat pipes, flanges, fanned enclosures, or other cooling devices.

Figure 6:
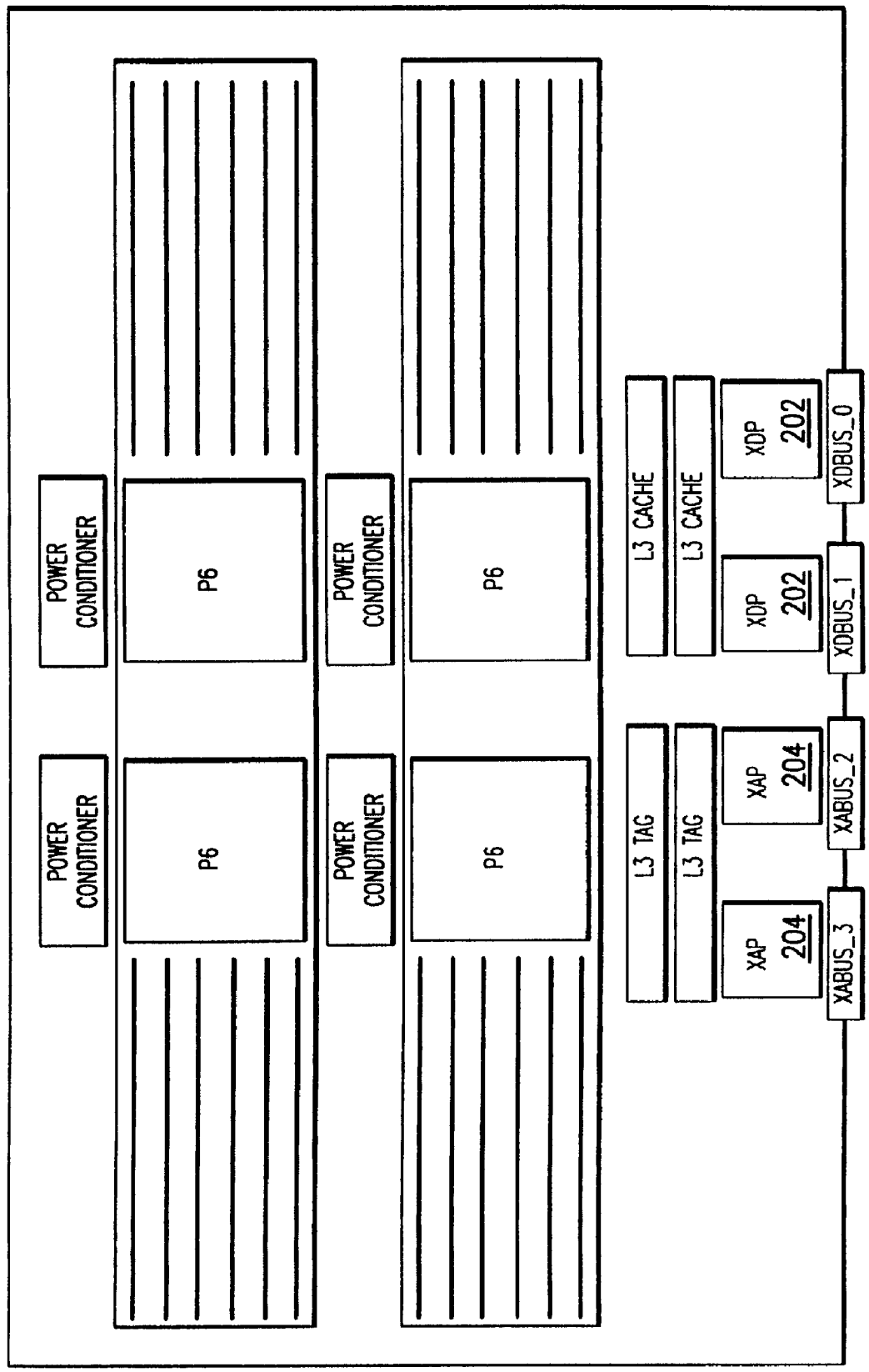
FIG. 6 is a schematic showing a dual XBus processor segment of one embodiment of the invention.

FIG. 6 shows an embodiment having dual XBus (XDP 202/XAP 204)segments. These segments are de-populated versions of the quad XBus segments shown in FIG. 5.

I/O Segment

In a preferred embodiment, I/O and processor segments are very similar in layout except two of the P6s and associated power conditioners, preferably located at the rear of the board, are replaced by Intel's 82454GX PCI Bridge. I/O Segments will be available with dual or quad XBuses. Additional logic will provide VGA, 100 MBit Ethernet, and P2P (PCI to PCI bridge with integrated I960 processor) capability. P2P may be used for multiple channel RAID and communication capability. Interconnection of I/O boards (preferably PCI or E/ISA) with the core is mainly a mechanical issue but one option was shown hereinabove for FIG. 4.

Memory Architecture

Figure 7:
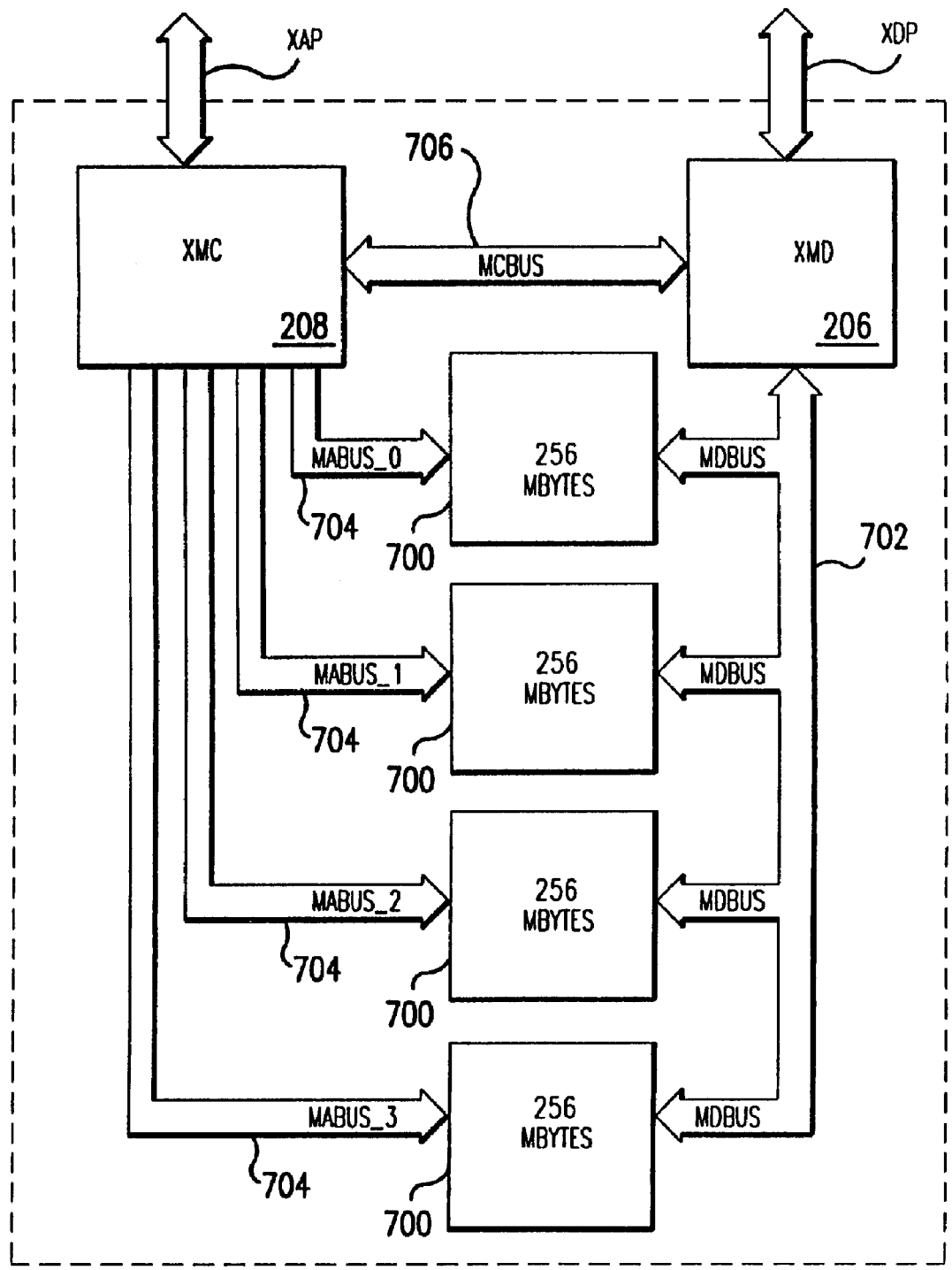
FIG. 7 is a schematic showing a memory segment block diagram of one embodiment of the invention.

FIG. 7 shows a memory bank of a memory segment. The memory segment in a preferred embodiment may be constructed using SDRAM (or its equivalent) memory technology. Use of SDRAMs, however, will allow data retrieval at bus clock rates without any need for additional logic (ASICs) for interleaving the memory structure. This minimizes design complexity and reduces the need for precious real estate, while also reducing latency, improving performance, and allowing smaller memory configurations while supplying multiple memory banks. Each memory segment, in addition to SDRAMs, will include an XMC 208, an XMD 206, and up to one GByte of memory in four independent memory banks 700.

Each bank 700, as shown in FIG. 7, is connected with a common 144 bit data path on the MDBus 702 to the XMD 206. Each bank will have separate address and control allowing simultaneous accesses over the MABus 704. A MCBus 706 control bus is provided for allowing communication between the XMC 208 and the XMD 206. In a preferred embodiment, the XMC 208 maximizes throughput on the MDBus 702 through management of its internal queues. In turn, the XMD 206 maximizes throughput to the XDBus 142 through management of its internal queues. The clock rate on the MDBus 702 will preferably be 66 to 75 MHZ (144 bit transfer) while the clock rate on the XDP will preferably be 133 to 150 MHZ (presuming 72 bit transfers). See discussion hereinabove regarding slower bus speeds and greater data path width.

In preferred embodiments of the invention, a maximum of 33 million accesses per second may be posted to a memory segment, which is a reference for every other clock from the same processor/I/O Segment. This may result in a maximum of 33 million data responses from one memory segment (over 1 GByte/sec). This large access capacity will allow a memory segment to support every access made by each CPU, as well as simultaneous accesses that may be directed at the same memory segment by multiple processor segments. The memory segment may also support the pre-fetch of the next cache line before it is requested, aborted references to dirty cache lines that will be provided by other processor segments, and aborted references due to hits is external cache.

Figure 8:
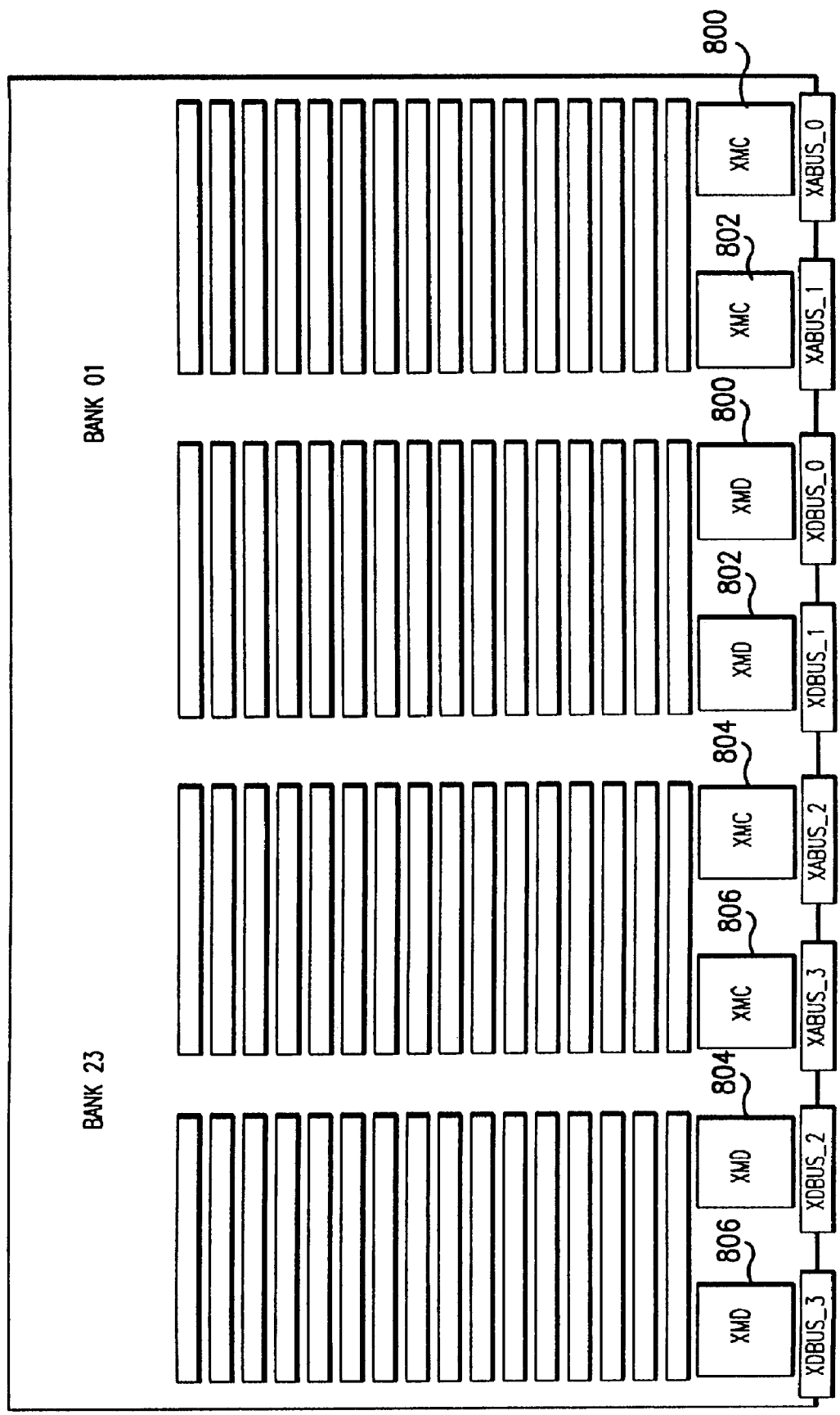
FIG. 8 is a schematic showing a memory segment layout of one embodiment of the invention.

FIG. 8 shows one possible layout for the memory board. In this design two SIMM sets are provided. Each set can house one GByte (Bank 01, or Bank 23). One set will be used for XBus_0 800 and XBus_1 802 while the other will be used for XBus_2 804 and XBus_3 806. In a preferred embodiment, only one set will be populated. This configuration will help accommodate the high data transfer rates from the SIMMs to their associated XMDs 206.

What is claimed is:

1. A method for maintaining coherent data in a multiprocessor system having a plurality of processors coupled to a memory segment, where each processor has a private cache, the method comprising:

tracking data entering and exiting a first processor so as to derive a status of the data in a private cache associated with the first processor;

storing the status in an external tag memory associated with the first processor, the external tag memory non-hardwired to the private cache associated with the first processor;

receiving a data request from a second processor, the data request requesting data associated with a memory location in the memory segment;

determining if the tag memory associated with the first processor indicates that the requested data is held within the private cache associated with the first processor;

snooping the first processor if the tag memory associated with the first processor indicates that the requested data is held within the private cache associated with the first processor;

re-posting the data request if the private cache associated with the first processor indicates it no longer holds the requested data, and setting the tag status for the requested data so as to indicate that the private cache associated with the first processor no longer holds the requested data;

storing data evicted by the first processor in an external cache associated with the first processor;

storing the status of data evicted by the first processor in the external tag memory associated with the first processor;

posting a transaction of the requested data from the external cache if the status indicates that the first processor has evicted the requested data, that the requested data was modified, and that the first processor has not re-requested the data; and posting a transaction of the requested data from the external cache if the status indicates that the first processor has evicted the requested data and that the requested data was not modified.

2. A method for maintaining coherent data in a multiprocessor system having a plurality of processor segments, each processor segment being in inter-segment communication via a system bus which is coupled to a memory segment, each processor segment including a processor segment bus connected to at least one processor having a private cache, the method comprising:

tracking data entering and exiting a first processor segment to derive a status of data in a private cache associated with a first processor in the first processor segment;

storing the status in an external tag memory associated with the first processor segment, the external tag memory non-hardwired to the private cache associated with the first processor;

receiving a request on the system bus from a processor in a second processor segment for data associated with a memory location in the memory segment;

determining if the tag memory associated with the first processor segment indicates that the requested data is held within the private cache associated with the first processor;

snooping the first processor segment if the tag memory associated with the first processor segment indicates that the requested data is held within the first processor segment;

re-posting the data request if the private cache associated with the first processor indicates it no longer holds the requested data, and setting the tag status for the requested data so as to indicate that the private cache associated with the first processor no longer holds the requested data;

storing data evicted by the first processor in an external cache associated with the first processor segment;

storing the status of data evicted by the first processor in the external tag memory associated with the first processor segment;

posting a transaction of the requested data from the external cache if the status indicates that the first processor has evicted the requested data, that the requested data was modified, and that the first processor has not re-requested the data; and posting a transaction of the requested data from the external cache if the status indicates that the first processor has evicted the requested data and that the requested data was not modified.

3. A method for maintaining coherent data in a multiprocessor system having a plurality of processor segments, each segment being in inter-segment communication via a system bus which is coupled to a memory segment, each processor segment including a processor segment bus and at least one processor having a private cache, the method comprising:

tracking data entering and exiting a first processor segment via the system bus to derive a status of data in a private cache associated with a first processor in the first processor segment;

storing the status in an external tag memory associated with the first processor segment;

receiving a request on the system bus from a processor in a second processor segment for data associated with a memory location in the memory segment;

determining if the tag memory associated with the first processor segment indicates that the requested data is held within the private cache associated with the first processor;

snooping the first processor segment if the tag memory associated with the first processor segment indicates that the requested data is held within the first processor segment;

re-posting the data request if the private cache associated with the first processor indicates it no longer holds the requested data, and setting the tag status for the requested data so as to indicate that the private cache associated with the first processor no longer holds the requested data;

storing data evicted by the first processor in an external cache associated with the first processor segment;

storing the status of data evicted by the first processor in the external tag memory associated with the first processor segment;

posting a transaction of the requested data from the external cache if the status indicates that the first processor has evicted the requested data, that the requested data was modified, and that the first processor has not re-requested the data; and posting a transaction of the requested data from the external cache if the status indicates that the first processor has evicted the requested data and that the requested data was not modified.

4. A method for maintaining coherent data in a multiprocessor system having a plurality of processors coupled to a memory segment, where each processor has a private cache, the method comprising:

tracking data entering and exiting a first processor so as to derive a status of the data in a private cache associated with the first processor;

storing the status in an external tag memory associated with the first processor, the external tag memory non-hardwired to the private cache associated with the first processor;

receiving a data request from a second processor, the data request requesting data associated with a memory location in the memory segment;

determining if the tag memory associated with the first processor indicates that the requested data is held within the private cache associated with the first processor;

snooping the first processor if the tag memory associated with the first processor indicates that the requested data is held within the private cache associated with the first processor;

re-posting the data request if the private cache associated with the first processor indicates it no longer holds the requested data, and setting the tag status for the requested data so as to indicate that the private cache associated with the first processor no longer holds the requested data;

determining if the tag status is correct in indicating that the requested data is modified;

re-posting the data request and setting the tag status for the requested line so as to indicate that the first processor no longer holds the requested data, if the tag status incorrectly indicates that the requested data is modified; and posting a transaction of the requested data from the private cache if the tag status correctly indicates that the requested data is modified.

5. A method for maintaining coherent data in a multiprocessor system having a plurality of processor segments, each processor segment being in inter-segment communication via a system bus which is coupled to a memory segment, each processor segment including a processor segment bus connected to at least one processor having a private cache, the method comprising:

tracking data entering and exiting a first processor segment to derive a status of data in a private cache associated with a first processor in the first processor segment;

storing the status in an external tag memory associated with the first processor segment, the external tag memory non-hardwired to the private cache associated with the first processor;

receiving a request on the system bus from a processor in a second processor segment for data associated with a memory location in the memory segment;

determining if the tag memory associated with the first processor segment indicates that the requested data is held within the private cache associated with the first processor;

snooping the first processor segment if the tag memory associated with the first processor segment indicates that the requested data is held within the first processor segment;

re-posting the data request if the private cache associated with the first processor indicates it no longer holds the requested data, and setting the tag status for the requested data so as to indicate that the private cache associated with the first processor no longer holds the requested data;

determining if the tag status is correct in indicating that the requested data is modified;

re-posting the data request and setting the tag status for the requested line so as to indicate that the first processor no longer holds the requested data, if the tag status incorrectly indicates that the requested data is modified; and posting a transaction of the requested data from the private cache if the tag status correctly indicates that the requested data is modified.

6. A method for maintaining coherent data in a multiprocessor system having a plurality of processor segments, each segment being in inter-segment communication via a system bus which is coupled to a memory segment, each processor segment including a processor segment bus and at least one processor having a private cache, the method comprising:

tracking data entering and exiting a first processor segment via the system bus to derive a status of data in a private cache associated with a first processor in the first processor segment;

storing the status in an external tag memory associated with the first processor segment;

receiving a request on the system bus from a processor in a second processor segment for data associated with a memory location in the memory segment;

determining if the tag memory associated with the first processor segment indicates that the requested data is held within the private cache associated with the first processor;

snooping the first processor segment if the tag memory associated with the first processor segment indicates that the requested data is held within the first processor segment;

re-posting the data request if the private cache associated with the first processor indicates it no longer holds the requested data, and setting the tag status for the requested data so as to indicate that the private cache associated with the first processor no longer holds the requested data;

determining if the tag status is correct in indicating that the requested data is modified;

re-posting the data request and setting the tag status for the requested line so as to indicate that the first processor no longer holds the requested data, if the tag status incorrectly indicates that the requested data is modified; and posting a transaction of the requested data from the private cache if the tag status correctly indicates that the requested data is modified.

* * * * *

UNITED STATES PATENT AND TRADEMARK OFFICE
CERTIFICATE OF CORRECTION

PATENT NO.        : 7,584,330 B2
APPLICATION NO.   : 10/886231
DATED             : September 1, 2009
INVENTOR(S)       : McKinney et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 451 days.

Signed and Sealed this

Fourteenth Day of September, 2010

David J. Kappos
*Director of the United States Patent and Trademark Office*